United States Patent [19]

Crook et al.

[11] Patent Number: 5,274,336
[45] Date of Patent: Dec. 28, 1993

[54] CAPACITIVELY-COUPLED TEST PROBE

[75] Inventors: David T. Crook; John M. Heumann; John E. McDermid, all of Loveland; Ronald J. Peiffer, Fort Collins; Ed O. Schlotzhauer, Loveland, all of Colo.

[73] Assignee: Hewlett-Packard Company, Palo Alto, Calif.

[21] Appl. No.: 820,711

[22] Filed: Jan. 14, 1992

[51] Int. Cl.$^5$ .............................................. G01R 27/26
[52] U.S. Cl. ..................... 324/690; 324/149; 324/158 P
[58] Field of Search ............... 324/690, 72.5, 149, 324/158

[56] References Cited

U.S. PATENT DOCUMENTS

| | | | |
|---|---|---|---|
| 4,318,042 | 3/1982 | Eda et al. | 324/72.5 |
| 4,654,603 | 3/1987 | Cox | 330/292 |
| 4,760,342 | 7/1988 | Conrads et al. | 324/72.5 X |
| 4,766,368 | 8/1988 | Cox | 324/688 |
| 4,801,866 | 1/1989 | Wixley | 324/72.5 X |

FOREIGN PATENT DOCUMENTS 2143954A 2/1985 United Kingdom .

OTHER PUBLICATIONS

G. M. Ettinger, L. T. Shooter and M. Tillier, "Noncontact Test Signal Acquisition," Microprocessors and Microsystems, vol. 6, No. 2, Mar., 1982, pp. 69-71.
Neil Benjamin, "High-Impedance Capacitive Divider Probe For Potential Measurements In Plasmas", Rev. Sci. Instrum., vol. 53(10), Oct., 1982, pp. 1541-1543.

*Primary Examiner*—Kenneth A. Wieder
*Assistant Examiner*—Glenn W. Brown

[57] ABSTRACT

The invention is a capacitively coupled probe which can be used for non-contact acquisition of both analog and digital signals. The probe includes a shielded probe tip, a probe body which is mechanically coupled to the probe tip, and an amplifier circuit disposed within the probe body. The amplifier circuit receives a capacitively sensed signal from the probe tip and produces an amplified signal in response thereto. The amplifier has a large bandwidth to accommodate high-frequency digital signals. Further, the amplifier has a very low input capacitance and a high input resistance to reduce signal attenuation and loading of the circuit being probed. The amplifier circuit is disposed in the probe body closely adjacent to the probe tip in order to reduce stray and distributed capacitances. A reconstruction circuit reconstructs digital signals from the amplified capacitively sensed signal.

16 Claims, 19 Drawing Sheets

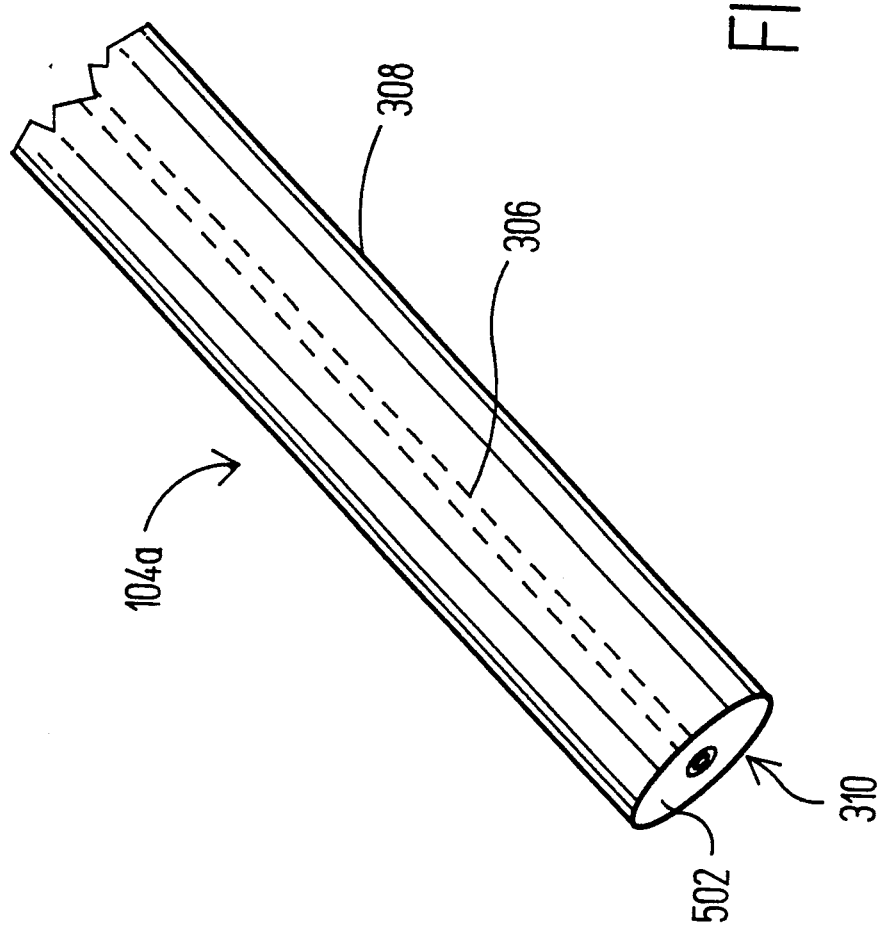

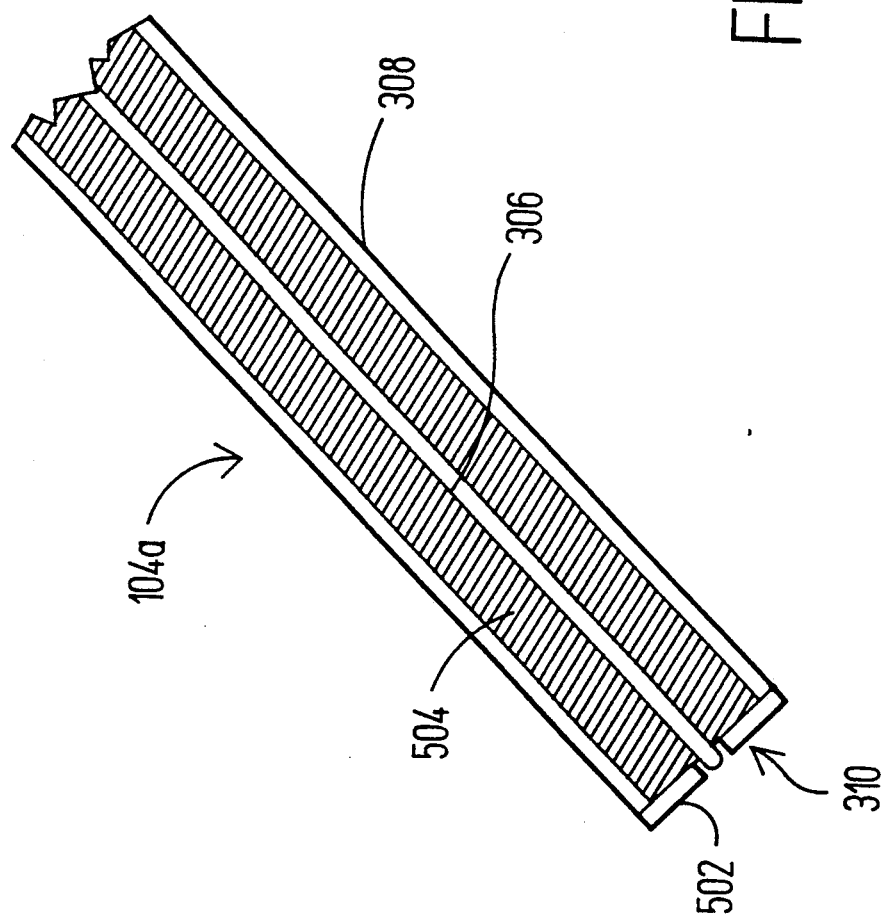

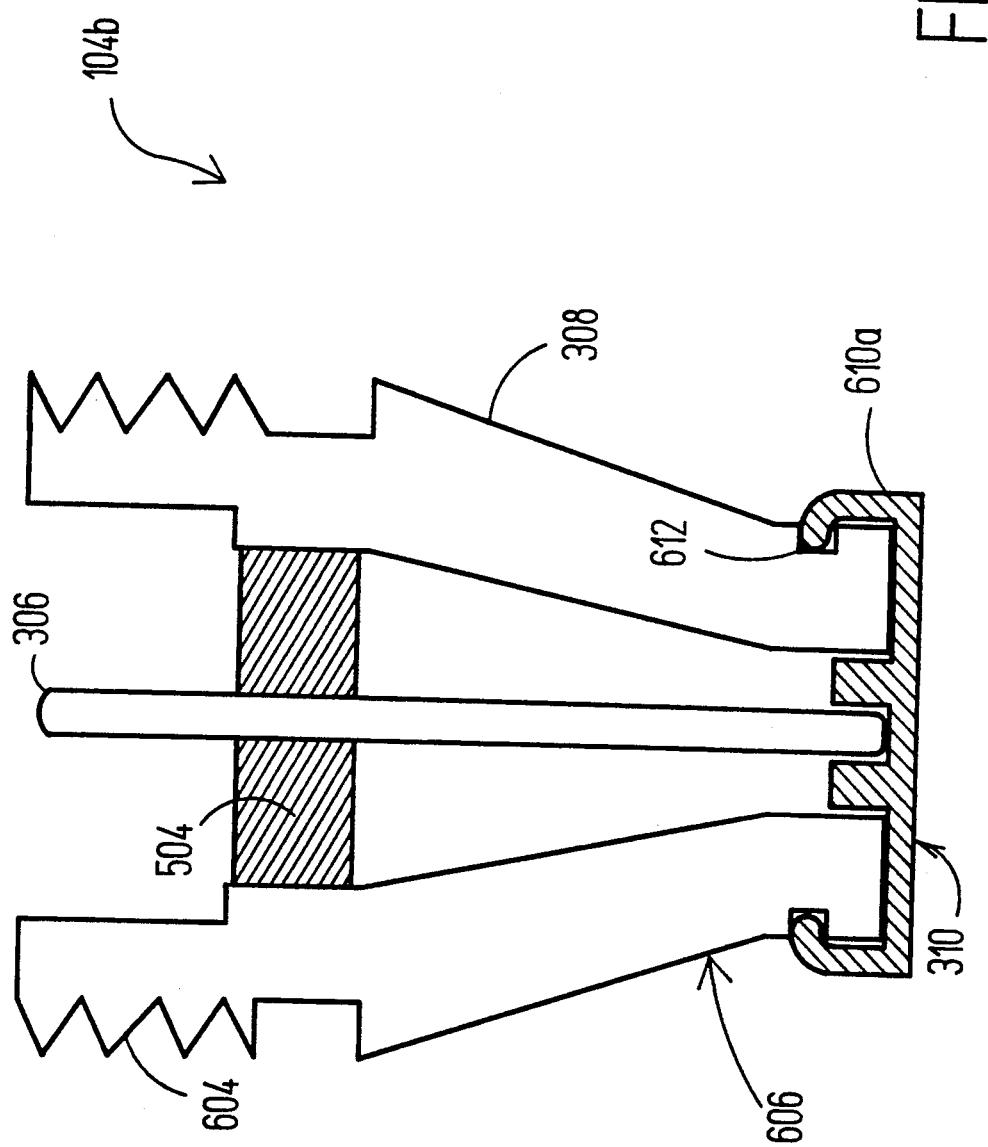

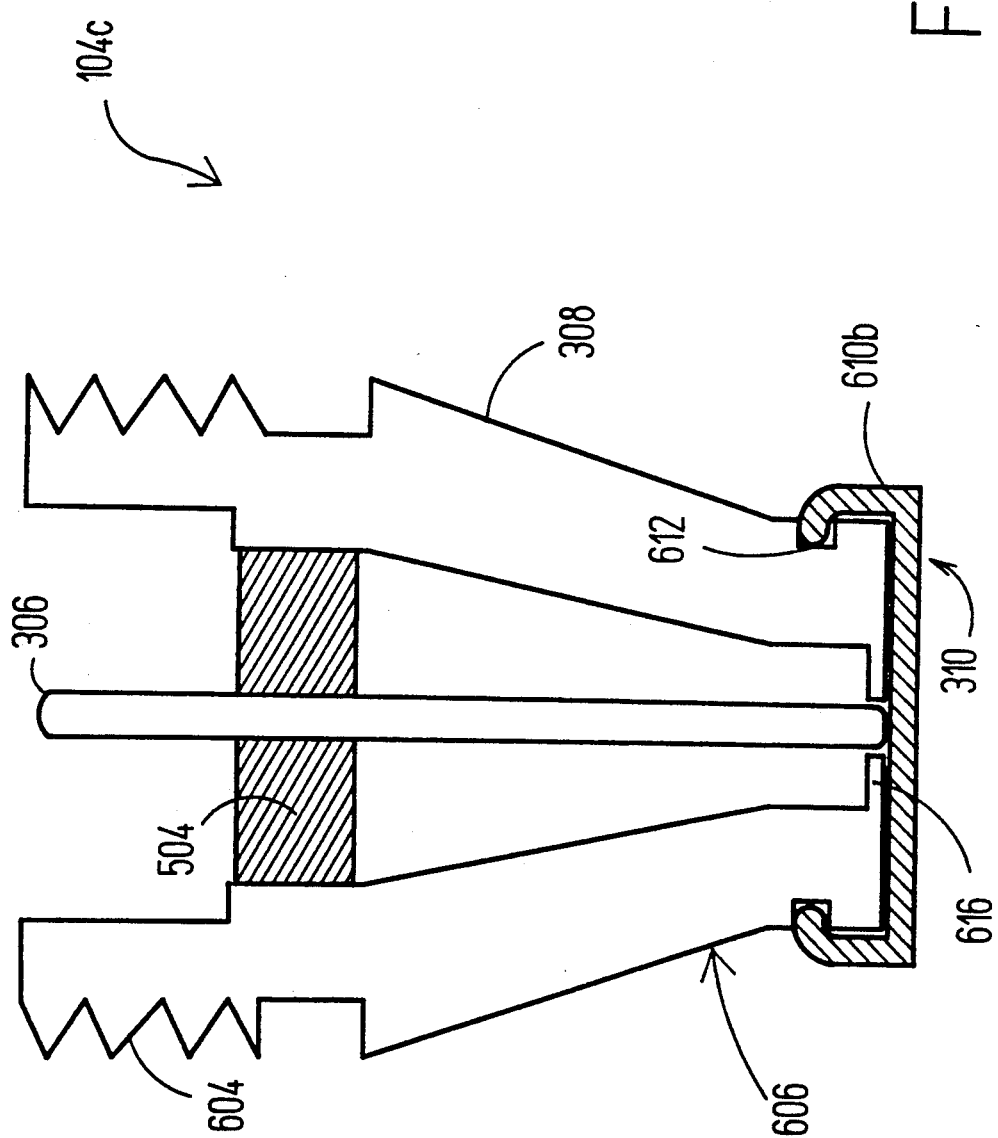

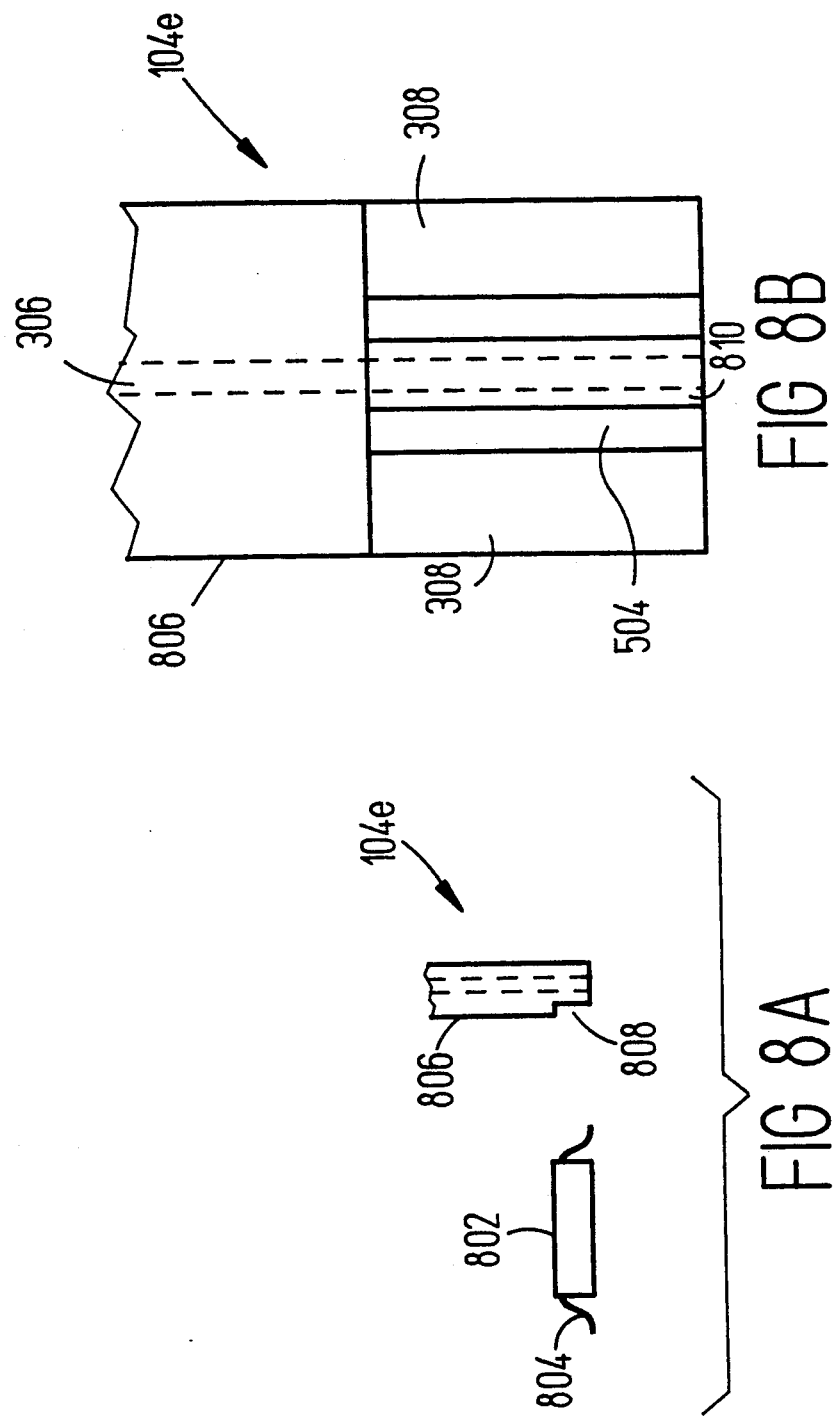

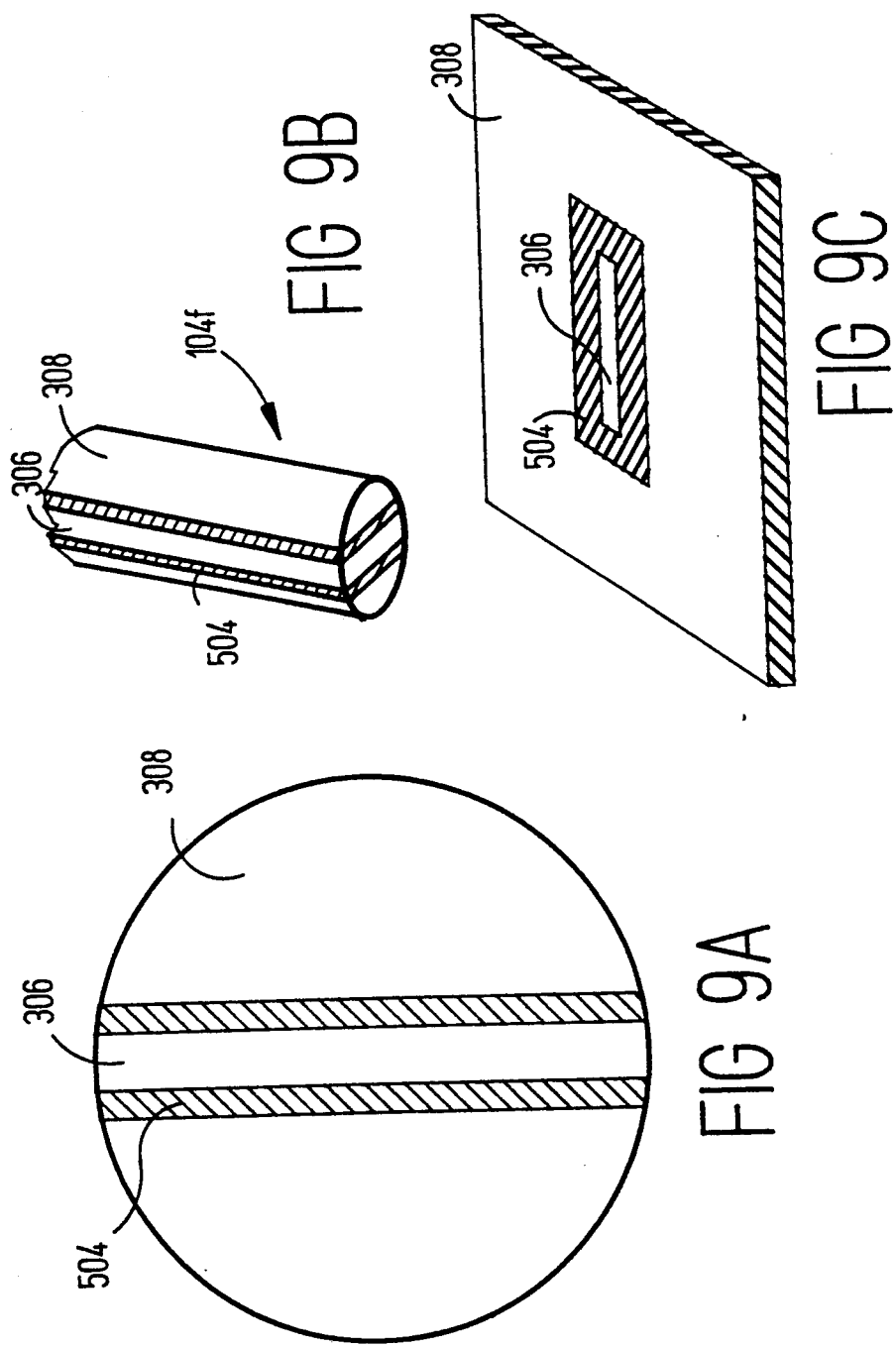

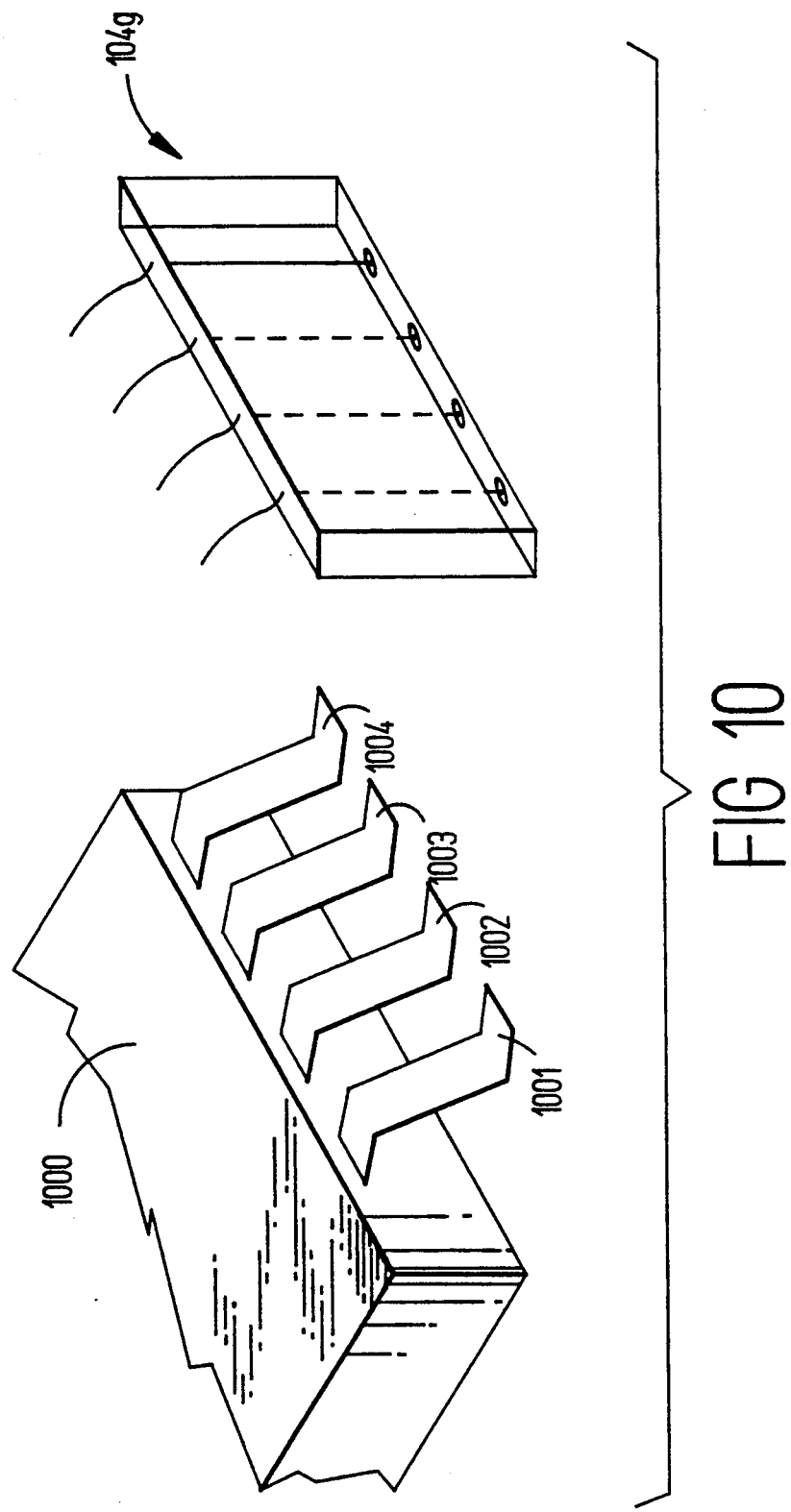

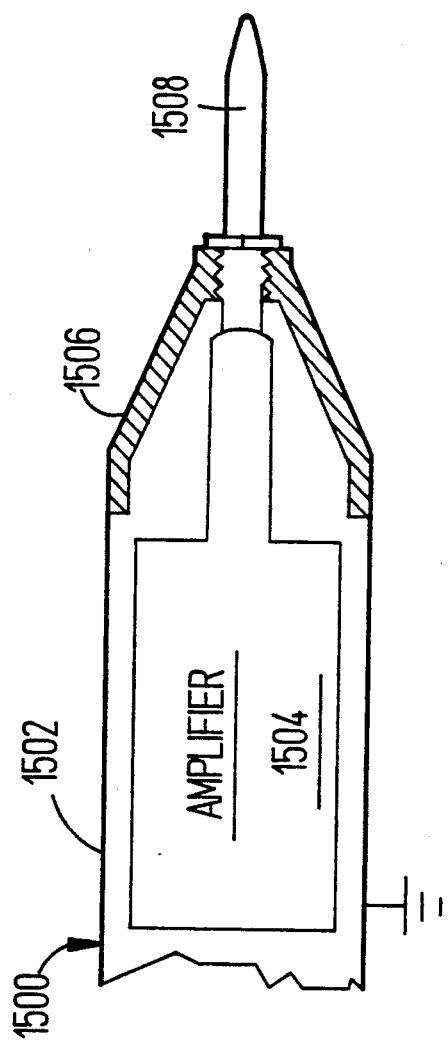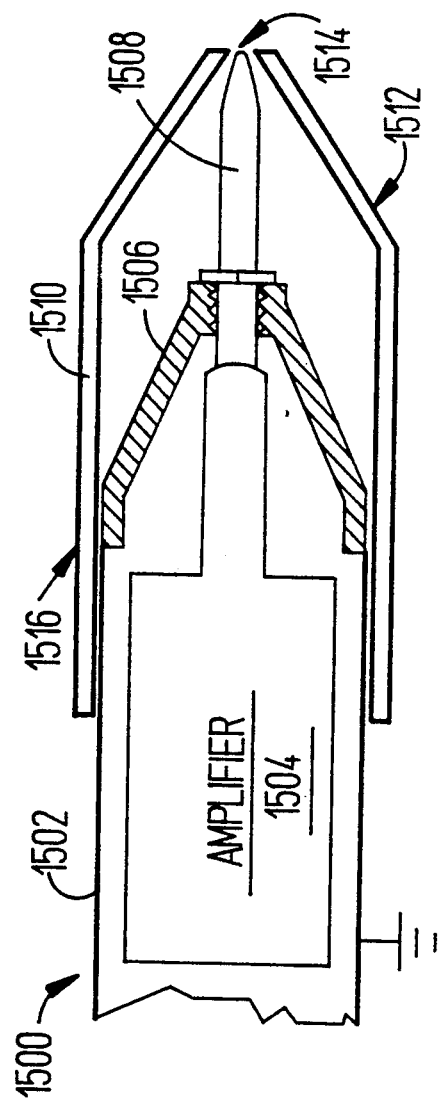

CAPACITIVELY-COUPLED TEST PROBE

FIELD OF THE INVENTION

This invention relates generally to the field of powered testing of electronic circuits. More particularly, the invention relates to non-contact test signal acquisition.

BACKGROUND OF THE INVENTION

Traditionally, automated printed circuit board testing involved a functional test wherein input signals were provided to the external inputs of a printed circuit board (PCB) and output signals were observed from the external outputs of the PCB. Also known as "edge-connector functional testing", this type of testing can become very complicated for complex circuitry and can provide only limited diagnostics. Accordingly, modern testing has increasingly supplemented and even replaced this traditional functional test with the efficient, flexible in-circuit test.

In-circuit test is a type of functional circuit test wherein the performance of each digital integrated circuit (IC) on a PCB is independently tested as an independent, functional unit. In order to accomplish this, a tester must apply input signals directly to the inputs of a DUT (device under test) and must access the outputs of the DUT to observe the output response. Each digital IC can then be tested as if it were electrically isolated from the circuit. This allows the in-circuit test to provide excellent diagnostics.

Further, because the devices are independently tested, tests for many common digital IC's can be programmed once, in advance, stored in a library, and then called upon when needed. This greatly simplifies test generation since this pre-programmed test can be used over and over again.

The nodal access required for in-circuit test is achieved using a "bed-of-nails" fixture. The "bed-of-nails" includes a plurality of spring-loaded conductive probes that make ohmic contact directly with the device I/O (input/output) pins from pads or traces on the surface of the PCB. To accomplish this, each node requiring test access must be available at the surface of the PCB and must have sufficient dimensions to allow an individual test probe to make physical (i.e., ohmic) contact with it. If physical contact is not possible, then in-circuit testing may be frustrated.

Lack of test access is precisely the problem that faces test engineers today. Component miniaturization and increasing densities of electronic circuits have vastly reduced node accessibility such that test signal acquisition is becoming increasingly difficult. As designers implement high density components on ultra fine pitch, multi-layer PCB's, many conductors are either not accessible or are too small to be contacted by conventional probing techniques.

For example, the traditional medium scale integration (MSI) chip has given way to the large scale integration (LSI) chip and the very large scale integration (VLSI) chip. The conventional dual-in-line package for these chips has been supplemented by hybrid packages (i.e., bare silicon chips mounted on a common ceramic or silicon substrate), TAB (Tape Automated Bonding), and surface mount. Most recently, state of the art technologies are pushing integration well beyond VLSI. The resultant increase in operational clock speeds (e.g., $10^8$ Hz and beyond) has resulted in complex new packaging problems, which have in turn led to development of multichip modules (MCM's).

The MCM is a hybrid assembly which includes a plurality of silicon dies mounted on a common substrate. The same process which is used to form the interconnect system on the chip may be used to form the chip-to-chip interconnect on the substrate. The MCM allows more chips to be brought closer together to accommodate greater I/O rates and greater signal processing speeds. This is accomplished by using fine line and multi-layer interconnection features fabricated through thin film microlithographic techniques.

These state-of-the-art technologies have increased packaging densities at the cost of test accessibility. Design engineers can no longer guarantee the test engineers the node accessibility which they require. Many nodes are trapped on inner layers of a multi-layer PCB. Even if a node is present as an I/O pin of an IC, the fine-pitch geometries of the IC may prohibit probing with the contact-type probes.

These problems are forcing the test engineer to abandon the powerful in-circuit test and return to the more complicated edge-connector functional test. Even edge-connector functional testing frequently requires some degree of internal node access, however, if component-level diagnostics are to be obtained. For example, if an edge-connector test indicates a faulty PCB, it is frequently desirable to "backtrace" through the circuit from the failing output to find the source of the problem. Doing so requires access to outputs available only at internal nodes. Thus, while a return to edge-connector functional testing may alleviate the access problem, it by no means eliminates it.

Additionally, backtracing is frequently performed manually. This requires an operator to hold a probe in physical contact with a pad or other test point. Today's fine pitch geometries make this impractical. TAB devices, for example, frequently have leads on 10 mil (i.e., 10 thousandths of an inch) centers, or closer. At these dimensions, it becomes difficult to identify the leads, much less to probe them.

An additional problem caused by contact-type probing is that the physical force required to make contact may actually close an open-circuit (e.g., close a "cold" solder joint). This can make a problem connection difficult to locate.

Yet another problem which occurs with these conventional probing techniques is that of circuit loading. The load imposed on the circuit by the probe can corrupt the signal being sensed such that the test is invalidated. For example, a capacitive load as small as 1.0 pF may be enough to distrupt some high-frequency circuits.

A method of non-contact test signal acquisition has been suggested in G. Ettinger, et al., "Noncontact Test Signal Acquisition," *Microprocessors and Microsystems*, Vol. 6, No. 2, March 1982, pp. 69–71. Ettinger, et al., teach that a digital signal may be detected by capacitive coupling. For detection from a signal carrying source wire, a pickup wire is twisted around the source wire, or a spring clip is clamped around the source wire (e.g., for a distance of 7 mm). For detection from a PCB, a planar capacitive contact is secured to the board above the trace (e.g., 1.5 mm wide traces with 5 mm spacing). Each pickup lead is connected to a saturating receiver, the gate of a field effect transistor (FET), or a CMOS logic gate for signal detection/amplification. This method is claimed to be capable of sensing digital signals over the frequency range of 10 Khz to 10 Mhz.

Unfortunately, the Ettinger et al. teachings are not applicable to solve modern test problems. First, Ettinger et al. teach pickup lead (i.e., probe) sizes which are much too large for use with modern circuits. In order to probe today's ultra fine trace geometries, it is necessary to have an ultra fine probe tip with similar dimensions (e.g., with a diameter on the order of 4 to 10 mils). Traditionally, however, this small size has been considered incapable of producing sufficient capacitive coupling for signal acquisition.

This is because the signal will be attenuated by the proportion of the coupling capacitance to the sum of the input capacitance of the pickup circuit and the coupling capacitance. The coupling capacitance is proportional to the pickup lead (i.e., capacitor plate) surface area which is in proximity to the source wire or trace. Thus, for a fixed input capacitance, the smaller the probe size, the weaker the capacitively sensed signal will be. If the probe size is too small, then the signal will be attenuated beyond that which can be successfully discriminated from the electrical noise of the amplifier/pickup circuit. For example, the sizes of the Ettinger et al. pickup leads are claimed to yield coupling capacitances on the order of 1 pF to 33 pF, while an ultra fine probe tip might yield coupling capacitance on the order or 10 fF (i.e., 10 femtofarads or 0.01 pF). Thus, an ultra fine probe tip would produce a sensed signal at least 100 times smaller in magnitude than the pickup leads of Ettinger et al. The detection/amplification circuits used by Ettinger et al. will not function with input signals this small. Further, the large coupling capacitances taught in Ettinger et al. would produce unacceptable loading on many high-frequency circuits.

These limitations have heretofore prevented development of a commercially practical capacitive probe for test signal acquisition. Seeing little promise in capacitive sensing, the industry has turned to investigation of other technologies for a solution to its test problems.

For example, one method uses a plasma to form a conductive pathway between a trace and a sense electrode. The plasma is created by exciting the sense electrode with a laser. This method is discussed briefly in "Technique eases probing on dense PWBs," by Ashok Bindra, *Electronic Engineering Times*, Sep. 23, 1991, p. 110.

Another method places a crystal in proximity to the signal carrying conductor. The electric field from the conductor causes changes in the optical properties of the crystal which can be sensed using a laser. This phenomena is known as the Pockels Effect. See Tremblay, G., Meyrueix, P., and Peuzin, I., "Optical Testing of Printed Circuit Boards," *Proceedings of the 1988 International Test Conference*, pp. 695-699; and Poulsen, P.D., "Electro-optical techniques for non-contact circuit probing," *Proceedings of the Society of Photo-Optical Instrumentation Engineers*, vol. 153, 1978, pp. 33-39.

These and other exotic methods which are under development have not reached commercial availability due to a variety of technologic and economic obstacles which remain as yet unresolved.

SUMMARY OF THE INVENTION

The invention is a capacitively coupled probe which can be used for noncontact acquisition of both analog and digital signals. The probe includes a probe tip, a probe body which is mechanically coupled to the probe tip, and an amplifier circuit disposed within the probe body. The probe tip includes an inner conductor having a conductive shield which substantially surrounds it. The probe tip is produced with small dimensions corresponding to the size of the conductor being probed, and exhibits sub-picoFarad coupling capacitances. The shield limits the active region of the probe tip in order to reduce crosstalk from nearby conductors.

The amplifier circuit receives a capacitively sensed signal from the probe tip and produces an amplified signal in response thereto. The amplifier has a large bandwidth to accommodate high-frequency digital signals. Further, the amplifier has a very low input capacitance and a high input resistance to reduce signal attenuation and loading of the circuit being probed. The amplifier circuit is disposed in the probe body closely adjacent to the probe tip in order to further reduce the input capacitance of the amplifier by reducing stray and distributed capacitances.

The useful bandwidth of the probe extends from a low-frequency pole to a high-frequency pole. The location of the low-frequency pole is determined by the capacitance coupling the probe tip to the conductor being probed and the input resistance of the amplifier. The high-frequency pole results from the responsivity of the amplifier circuit itself. The low-frequency pole causes the probe to act as a differentiator such that the low-frequency components of the capacitively sensed signal are attenuated.

For analog signals, it is desirable to preserve the low-frequency components. Therefore, the low-frequency pole should be moved to as low a frequency as possible by maximizing the input resistance of the amplifier. It is also desirable to maximize the frequency of the high-frequency pole such that the useful bandwidth of the probe is increased. The sensed analog signal may be input directly into an oscilloscope or other instrument.

For digital signals, on the other hand, the high-frequency response of the amplifier is more important than the low-frequency response. A good high-frequency amplifier response is required in order to follow the fast edges of digital signals. The low-frequency component of the digital signal (which are lost in the differentiation) primarily consists of near DC frequencies which can be reconstructed using a reconstruction circuit. The reconstructed digital signal may then be analyzed or viewed on a test instrument, such as a logic analyzer.

One advantage of the present invention is that probing is no longer limited to vias, pads, and test points. Traces and other features under solder resist or conformal coating may now be probed. Further, with the addition of mechanical fixturing or robotic probe positioners, features which are too fine or too closely spaced for manual or conventional bed-of-nails probing may now be tested.

An additional advantage of the invention is that physical contact is not required for signal acquisition. This allows reliable probing of dirty, conformal coated, and solder masked PCB's. In fact, even traces present only on inner layers of a multi-layer PCB may be capacitively probed from the surface of the board provided that there are no intervening conductive planes or traces.

Yet another advantage of the invention is that the probe has very high input impedance such that its loading effects on the circuit being probed are minimal.

Still another advantage of the invention is that it can acquire high-frequency test signals (e.g., a 100 MHz square wave with 1 nsec edges).

The foregoing and other objects, features and advantages of the invention will be apparent from the following more particular description of a preferred embodiment of the invention, as illustrated in the accompanying drawings.

BRIEF DESCRIPTION OF THE DRAWINGS

FIG. 5(a) is a perspective view of a first sample embodiment of probe tip 104.

FIG. 5(b) is a cross-sectional view of the first sample embodiment of the probe tip 104 shown in FIG. 5(a).

FIG. 6(a) is a cross-sectional view of a second sample embodiment of probe tip 104.

FIG. 6(b) is a cross-sectional view of a third sample embodiment of the probe tip 104.

FIG. 8(a) is a side view of a fifth sample embodiment of the probe tip 104.

FIG. 8(b) is a front view of the fifth sample embodiment of the probe tip 104.

FIG. 9(a) is a bottom view of a sixth sample embodiment of the probe tip 104.

FIG. 9(b) is a perspective view of a sixth sample embodiment of the probe tip 104.

FIG. 9(c) is a perspective view of a variation of sixth sample embodiment of the probe tip 104.

FIG. 10 is a perspective view of a seventh sample embodiment of the probe tip 104.

FIG. 15(a) is a cross-sectional diagram of a conventional, active oscilloscope probe.

FIG. 15(a) is a cross-sectional diagram of a conventional, active oscilloscope probe which has been converter to a non-contact probe according to the invention.

DESCRIPTION OF THE PREFERRED EMBODIMENT

The invention is an apparatus and method for non-contact probing of electrical signals by using a miniature capacitively coupled probe. While directed to the unique problems of digital test signal acquisition, the invention has equal utility for acquisition of analog signals. The terms "capacitive" and "non-contact" are used interchangeably herein and refer to coupling in the absence of ohmic contact.

A "probe" is a device which contains the electrical signal sensing element for another piece of electronic equipment. The probe of the invention has utility for sensing electrical signals from PCB traces, vias, pads, I/O pins, and other electrical conductors. The signals may be acquired through intervening solder mask, conformal coating, or one or more dielectric layers of a multi-layer PCB, hybrid, or MCM. For ease of reference, the term "trace" shall be used herein to refer to any electrical signal carrying conductor from which signal acquisition is desired. When dimensions are discussed, the units used are mils. A "mil" is equal to one thousandth of an inch (i.e., 0.001").

The invention is now described with reference to the figures where like reference numbers are used to indicate like elements.

OVERVIEW

Figure 1:
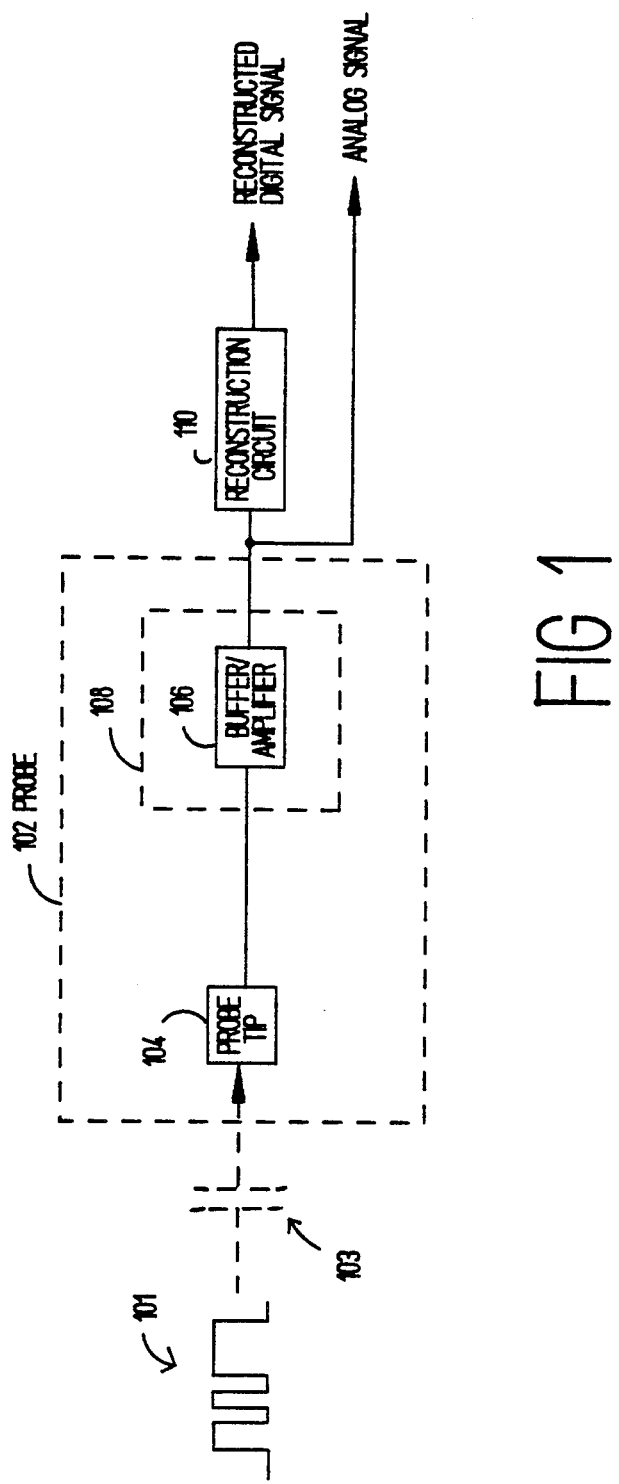
FIG. 1 is a block diagram of the invention.

FIG. 1 is a high-level block diagram of the invention. An analog or digital signal 101 is capacitively sensed by a probe 102 via probe tip 104. A buffer/amplifier circuit 106 (hereinafter "amplifier" 106) disposed in probe body 108 is adapted to receive (and preferably amplify) the capacitively sensed signal. Amplifier 106 is located in probe 102 in close proximity to probe tip 104 as discussed in detail below.

The signal from amplifier 106 may be viewed directly on an oscilloscope, a distortion meter, or a spectrum analyzer (e.g. especially for analog signals); or may be fed into a reconstruction circuit 110 (for digital signals). Reconstruction circuit 110 reconstructs digital signal 101 from the capacitively sensed signal. Reconstruction is required because the capacitance which couples probe tip 104 to the trace being probed results in high-pass filtering or differentiation of the signal. This "coupling capacitance" is represented by capacitor 103 in FIG. 1.

Figure 2:
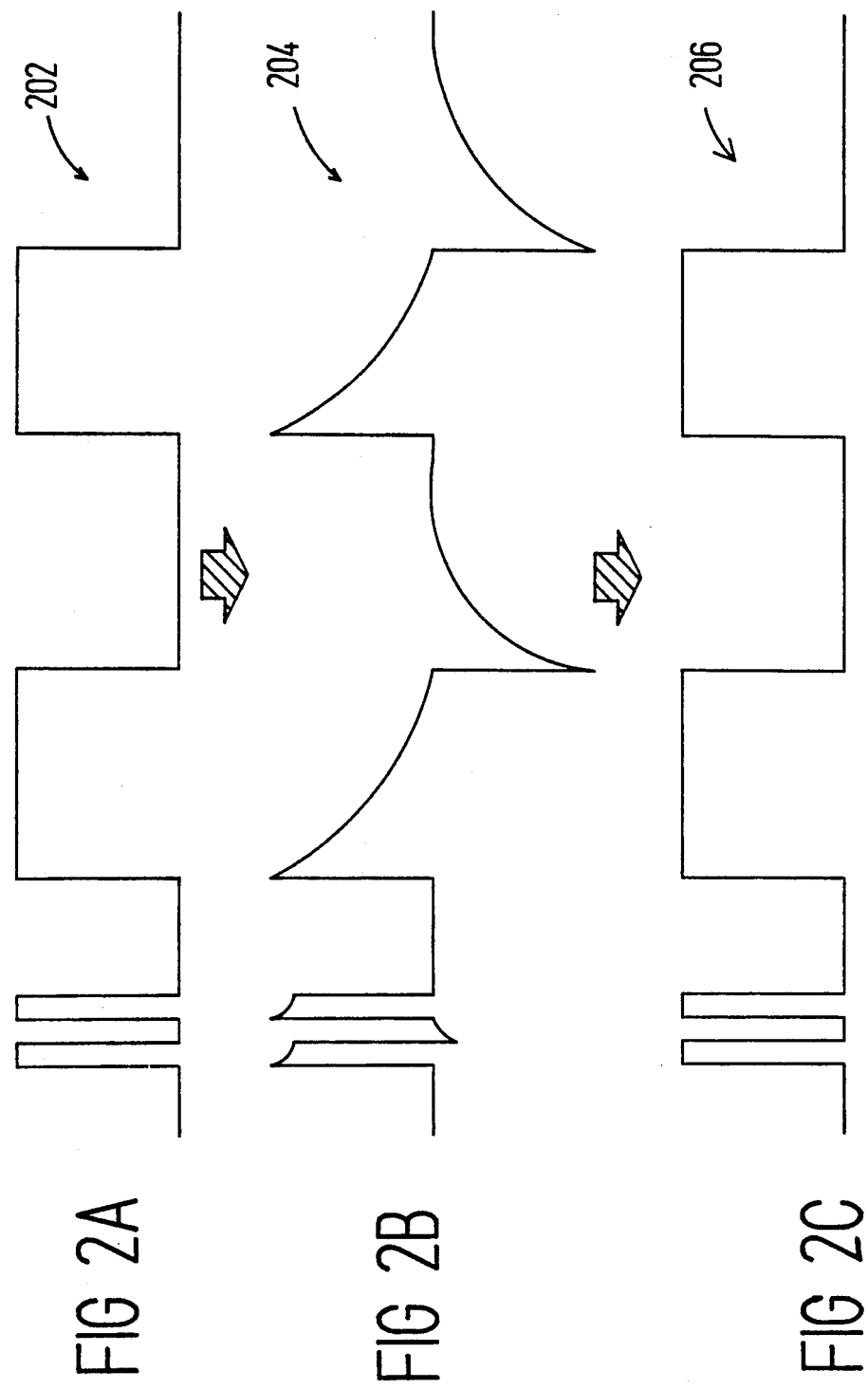
FIG. 2(a) is a sample digital signal to be acquired for test.
FIG. 2(b) is the signal of FIG. 2(a) after it has been differentiated by the coupling capacitance.
FIG. 2(c) is the signal of FIG. 2(b) after it has been reconstructed by reconstruction circuit 110.

Differentiation of a signal is illustrated in FIG. 2. FIG. 2(a) shows a sample digital signal 202 to be sensed. FIG. 2(b) shows the sensed signal 204 as it appears at the output of amplifier 106. Note that signal 204 has been differentiated. This results in a loss of all DC levels and low-frequency changes in the sensed signal. Reconstruction circuit 110, however, reconstructs the differentiated signal 204 to produce a reconstructed digital signal 206, shown in FIG. 2(c).

PROBE TIP

Figure 3:
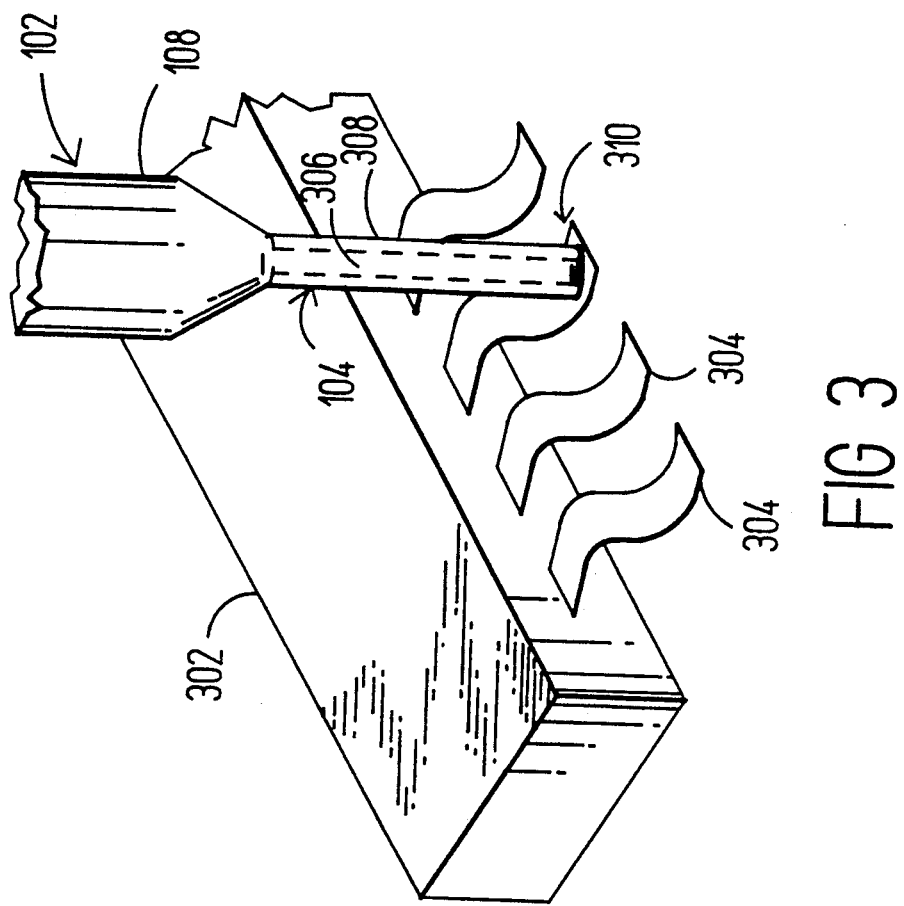
FIG. 3 is a perspective view of a sample IC chip being probed by the capacitively coupled probe of the invention.

FIG. 3 shows a sample IC chip 302 having a plurality of I/O (input/output) pins 304. The non-contact test probe 102 of the invention is shown positioned above one I/O pins 304. As discussed above, probe 102 includes probe body 108 and probe tip 104. Probe tip 104 includes an inner conductor 306 and an outer conductor or shield 308 arranged in a coaxial configuration. Inner conductor 306 is adapted to capacitively receive an electrical signal from a target trace or conductor (e.g., an I/O pin 304) at a sense end 310 of probe tip 104. Shield 308 shields inner conductor 306 from capacitive interference (i.e., crosstalk) from nearby conductors.

Modern PCB's have traces as small as 4 mils in width with a 4 mil spacing between traces. In order to optimally capture a signal from such traces, a probe tip should have an "active region" with similar dimensions. "Optimal" capturing of a signal includes acquiring the signal with sufficient amplitude to allow reconstruction while minimizing crosstalk and loading of the circuit under test. Crosstalk is interference by signals from nearby traces.

Figure 4:
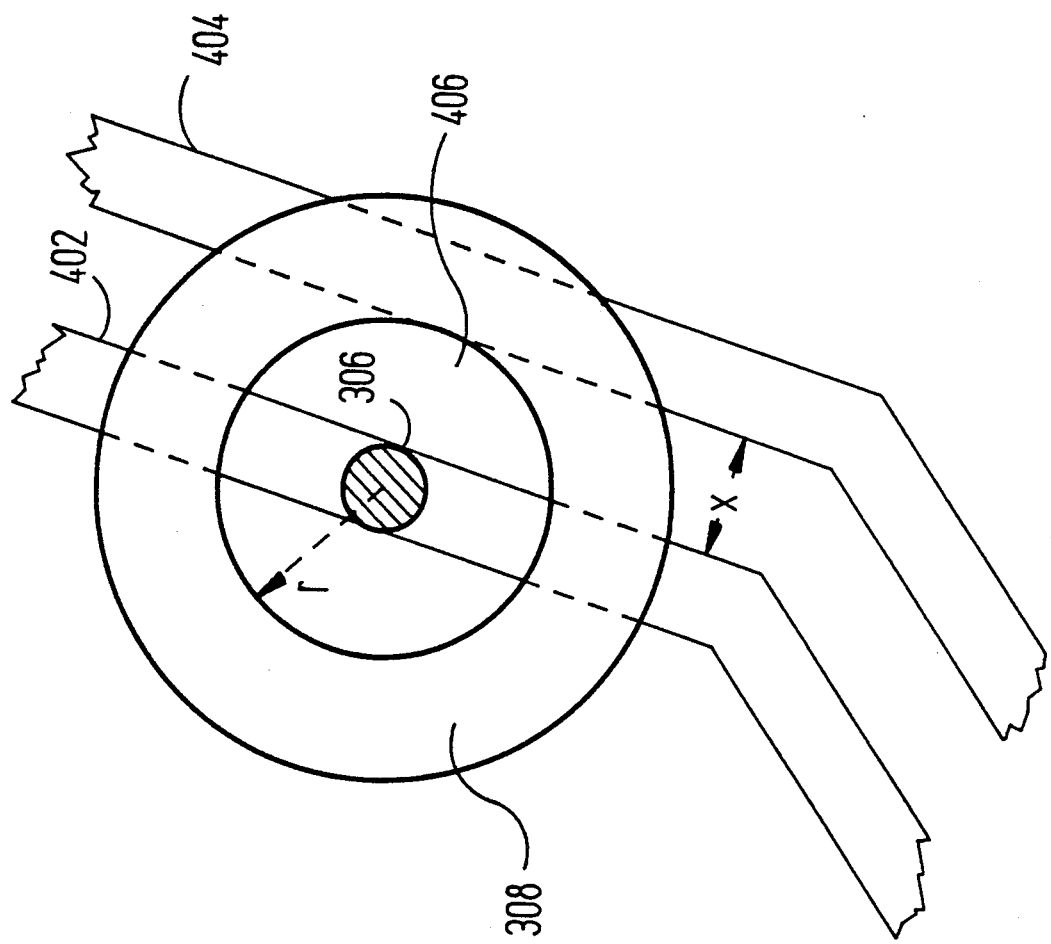
FIG. 4 is a top view illustrating the dimensional relationship between probe tip 104 and two sample traces of a PCB.

Referring now to FIG. 4, the active region of probe tip 104 is described. A first sample trace 402 is shown adjacent to a second sample trace 404. A cross-section of probe tip 104 including inner conductor 306 and shield 308 is shown superimposed over traces 402,404. The inner radius r of shield 308 defines a circle which includes inner conductor 306 and a space 406 between shield 308 and inner conductor 306. This area defined by inner radius r is the "active region" of probe tip 104.

In order to effectively probe trace 402 without substantial interference from a signal on trace 404, it is preferred that the active region of probe tip 104 not extend over any portion of trace 404 when probing trace 402. That is, the inner radius r of shield 308 should be less than the sum of the distance x between traces 402,404 plus one half the thickness of a trace. The smaller the active region of the probe is made, the better the rejection of crosstalk will be. However, as discussed below, decreasing r causes an increase in the capacitance of the probe tip.

The diameter of inner conductor 306 should be as large as the width of the smallest trace. This allows for maximum coupling with the trace. Making the inner conductor any smaller will unnecessarily reduce the capacitive coupling and attenuate the sensed signal. Making the inner conductor larger will increase the probability of crosstalk.

Probe tip 104 may comprise a small piece of coaxial cable (hereinafter, "coax") as shown in FIGS. 5(a) and 5(b). Probe tip 104(a) includes a small length of semi-rigid coax. The inner conductor of the coax acts as inner conductor 306. The outer conductor of the coax acts as shield 308. An insulation layer 504 is disposed between the conductors. An end ring 502 is electrically connected to shield 308 at sense end 310.

End ring 502 is a conductive "washer" or disk element which acts to extend a small portion of shield 308 radially inward towards inner conductor 306. End ring 502 increases the shielding effects of shield 308 by simulating a reduction in the inner radius r of shield 308. This results in a reduction in the active region of the probe tip. Preferably, end ring 310, and shield 308, are coated with an insulating layer to prevent inadvertent electrical contact with nearby conductors during probing.

Probe tip 104(a) may be constructed from a short piece of 50 Ω, semi-rigid coax having the following approximate dimensions: an overall O.D. (outer diameter) of 85 mils, an inner conductor having a 20 mil O.D., and an end ring having a center opening (active region) with a 30 mil I.D. (inner diameter). While this embodiment of probe tip 104 is easily implemented, it is not useful for ultra fine traces (e.g., 4 mil thick traces spaced 4 mils apart) because of its relatively large size. For ultra fine applications, a probe tip as shown in either of FIGS. 6(a) or 6(b) may be constructed.

FIG. 6(a) shows a second sample embodiment 104(b) of probe tip 104. Probe tip 104(b) includes inner conductor 306 and shield 308 with an insulator 504 disposed therebetween. Insulator 504 may be made from known insulating materials (e.g., air, alumina, polyethylene, nylon, teflon, and the like). Shield 308 includes a threaded upper portion 604 and a tapered lower portion 606. Upper portion 604 is adapted to mate with probe body 108. An insulating, protective cap 610(a) protects and electrically insulates sense end 310 of lower portion 606. Cap 610(a) is secured to lower portion 606 by a "snap" fit into a peripheral groove 612 in lower portion 606. Alternatively, cap 610(a) may be replaced by an anodized coating on shield 308 and on inner conductor 306.

In order to accommodate a 4 mil trace size, probe tip 104(b) is similarly sized. For example, probe tip 104(b) may be constructed with the following approximate dimensions:

O.D. of inner conductor 306 = 4 mils
I.D. of shield 308 at sense end 310 = 12 mils
O.D. of sense end 310 with cap 610(a) = 30 mils
O.D. of threaded upper portion 604 = 48 mils
Overall length of probe tip 104(a) ≧ 70 mils These small dimensions are illustrative of a miniaturized probe tip which the present invention can achieve. The probe tip may be made larger than this example as dictated by the dimensions of the circuit to be probed. Also, the probe tip may be made longer to improve its reach for accessing crowded PCB's.

FIG. 6(b) shows a third sample embodiment 104(c) of probe tip 104. Probe tip 104(c) is substantially identical to probe tip 104(b). However, sense end 310 of shield 308 includes an end ring 616. End ring 616 is an integral part of lower portion 606 which results from extending a small portion of shield 308 radially inward towards inner conductor 306. As described above for end ring 502, end ring 616 increases the shielding effects of shield 308 by reducing the size of the active region of the probe tip. An insulating, protective cap 610 (b), protects and electrically insulates sense end 614(b) of lower portion 308.

As explained above, "coupling capacitance" is the capacitance seen between inner conductor 306 and a trace being probed. The coupling capacitance is a function of the geometry of probe tip 104, the geometry of the trace being probed, the spatial relationship between the probe tip and the trace, and the material (e.g., air) filling the space between the probe tip and the trace. Generally, the smaller the probe tip is, the smaller the coupling capacitance will be. For the sample embodiments of probe tip 104 set forth above, the coupling capacitance will be less than 100 fF (femto or $10^{-15}$ Farads), and preferably, will be on the order of 5 to 10 fF. These values of coupling capacitance have traditionally been considered far too small for practical application. The present invention, however, overcomes the limitations of the conventional art.

Figure 7A:
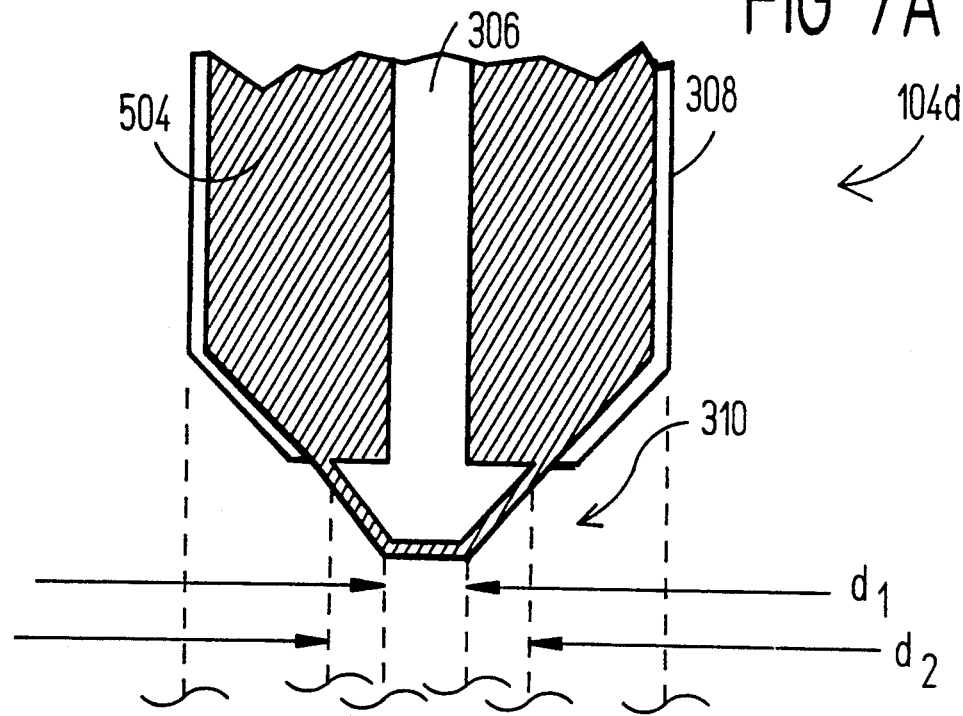
FIG. 7(a) is a cross-sectional view of a fourth sample embodiment of the probe tip 104.
Figure 7B:
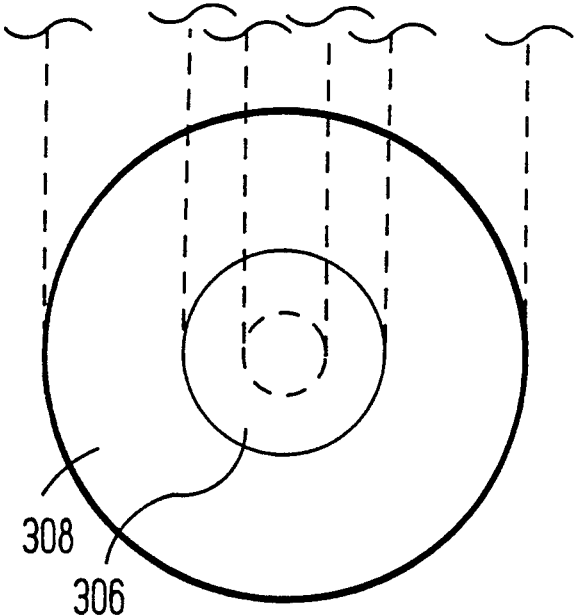
FIG. 7(b) is a bottom view of the fourth sample embodiment of the probe tip 104.

In addition to the embodiments set forth above, the inventors contemplate that probe tip 104 may be produced in a variety of alternate embodiments to correspond to the requirements of different applications. One alternate embodiment 104(d) is shown in FIG. 7. Probe tip 104(d) is adapted for coupling with a plated via (i.e., a plated through hole with an annular ring of plating). FIG. 7(a) is a cross-section of probe tip 104(d). FIG. 7(b) is a bottom view of probe 104(d). Probe tip 104(d) includes inner conductor 306 and shield 308 arranged in a coaxial arrangement. An insulation layer 504 disposed between conductor 306 and shield 308 extends over the tip of conductor 306 to cover sense end 310 of probe tip 104(d). Alternatively, inner conductor 306 and shield 308 may be anodized for electrical insulation.

The sense end of inner conductor 306 is formed in the shape of a truncated cone (i.e., a cone with the tip removed). As shown in FIGS. 7(a) and 7(b), the diameter of the base of the cone is $d_2$ and the diameter of the truncated tip of cone is $d_1$. This allows inner conductor 306 to easily mate with a via having a inner diameter between $d_1$ and $d_2$.

Figure 8C:
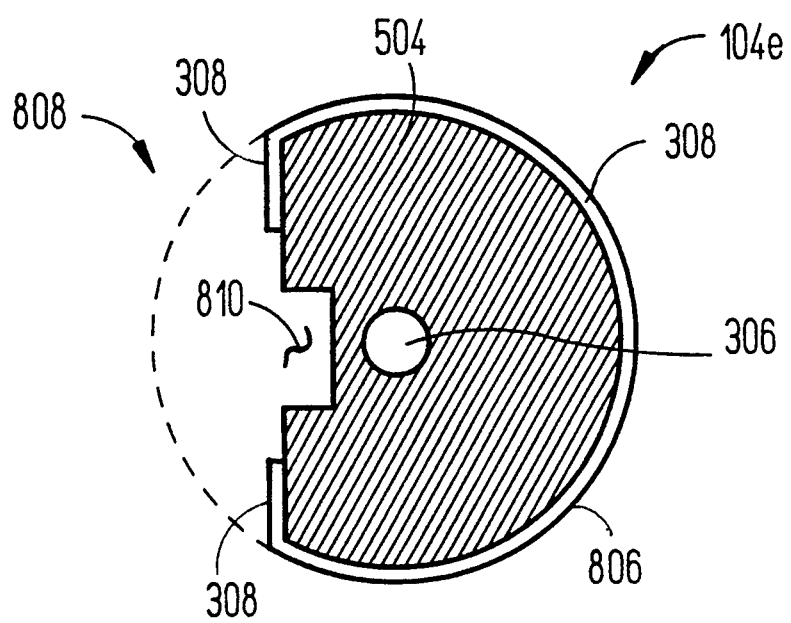
FIG. 8(c) is a bottom view of the fifth sample embodiment of the probe tip 104.

Another embodiment, 104(e), of probe tip 104 is shown in FIGS. 8(a)-(c). Probe tip 104(e) is designed to mate with a pin or leg 804 of an IC 802. Probe tip 104(e) includes a probe body 806 having a cut-out portion 808 adapted to mate with pin 804. FIG. 8(b) is a front view, and 8(c) is a bottom view of probe tip 104(e). Insulator 504 surrounds inner conductor 306. Shield 308 coaxially surrounds inner conductor 306 except for cut-out portion 808. A groove 810 is cut into insulation 504 to a depth which almost reaches inner conductor 306. Groove 810 defines the active region of probe tip 104(e). The width of groove 810 is slightly larger than the width of pin 804. Groove 810 is adapted to accept pin 804 to allow close capacitive coupling between inner conductor 306 and pin 804.

Yet another embodiment 104(f) of probe tip 104 is shown in FIG. 9. Probe tip 104(f) is designed to mate with long narrow traces. It is constructed using printed circuit fabrication technology, which is well known in the art. FIG. 9(a) is a bottom view showing an inner conductor 306 fabricated on a substrate of insulating material 504. Conductor 306 is fabricated to have geometries corresponding to a desired trace size. The conductor is elongated to provide the required coupling capacitance. Shield 308 is fabricated on either side of inner conductor 306. Insulator 504 isolates inner conductor 306 from shield 308. FIG. 9(b) shows a perspective view of probe tip 104(f). FIG. 9(c) shows a variation of etched probe tip 104(f).

Still another embodiment 104(g) of probe tip 104 is shown in FIG. 10. Probe tip 104(g) is an integrated probe array package designed to match common IC or other part geometries. For example, probe tip 104(g) is shown in a four channel embodiment which is adapted to capacitively couple with each of pins 1001-1004 of an IC 1000. Probe tip 104(g) may be fabricated as a single integrated package which includes an amplifier 106 for each channel to form a completed array of probes 102.

One of skill in the art will recognize that these several embodiments are not exhaustive but are provided as examples to illustrate the variety of configurations with which probe tip 104 may be constructed. Further, as the geometries of electronic circuits continue to decrease in size, it is anticipated that the size of probe tip 104, and thus probe 102, will follow.

BUFFER/AMPLIFIER

Designing amplifier 106 inevitably involves making many tradeoffs to customize the performance of the amplifier to the specific application at hand. Since all amplifiers have a limited gain-bandwidth product, the quintessential tradeoff is gain for bandwidth. Thus, while the general design consideration may be discussed, the ultimate design will depend on the intended application.

Figure 11:
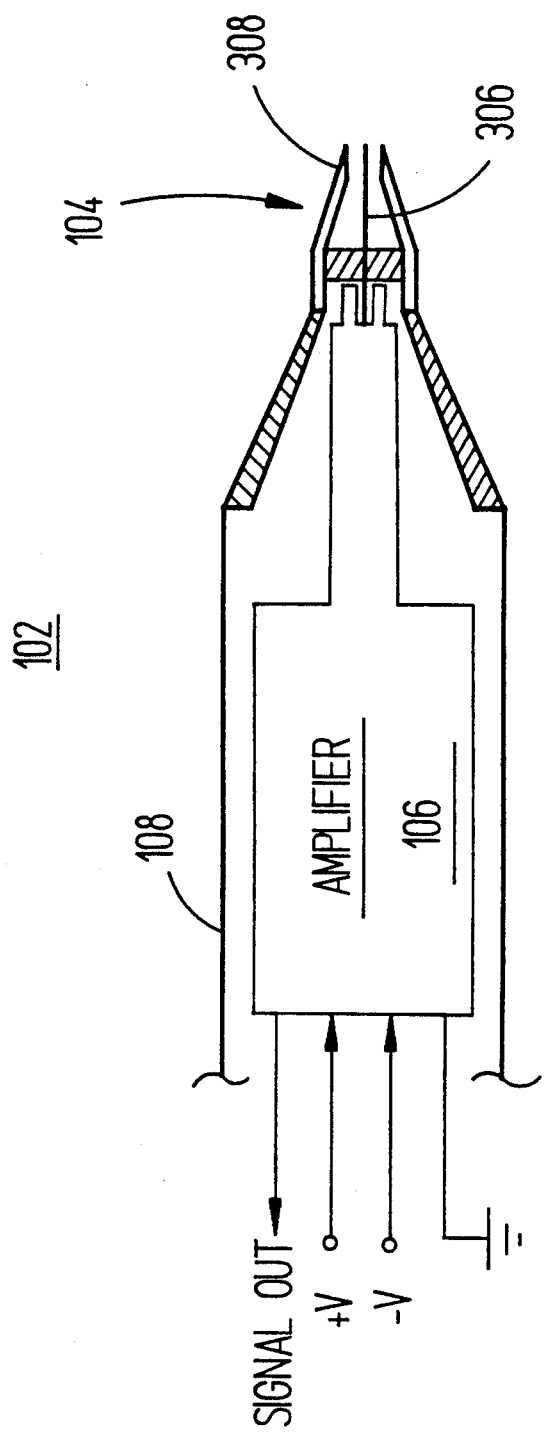
FIG. 11 is a simplified block diagram showing the location of buffer/amplifier circuit 106 in probe body 108.

When sensing capacitively, the signal will be attenuated by the proportion of coupling capacitance 103 to the sum of the input capacitance of amplifier 106 and coupling capacitance 103. Thus, it is desirable to minimize the input capacitance of amplifier 106 to reduce this capacitive-divider effect. The input capacitance of amplifier 106 includes the input capacitance of the amplifier itself, the capacitance of probe tip 104, as well as any distributed or parasitic capacitance introduced between probe tip 104 and amplifier 106. The capacitance of probe tip 104 is the capacitance between inner conductor 306 and shield 308. Distributed capacitances (e.g., from interconnecting wires, cables, traces or pins) may be reduced by mounting amplifier 106 as close to probe tip 104 as possible. To accomplish this, amplifier 106 is mounted in body 108 of probe 102 as shown in FIG. 11. Amplifier 106 may be manufactured as an IC, a hybrid microcircuit, or a miniaturized PCB to facilitate mounting in body 108.

The capacitance (between inner conductor 306 and shield 308) of probe tip 104 should also be kept to a minimum. Reducing the gap between shield 308 and conductor 306 to produce a fine pitch probe size (i.e., small active region), however, increases this capacitance. This conflict is resolved using end rings 502,616. The use of a thin end ring allows an increase in the shielding effects of shield 308 while minimizing the additional capacitance introduced to probe tip 104.

Minimizing the total input capacitance of amplifier 106 results in increased signal strength at the input of amplifier 106. The tradeoff is that a small input capacitance limits the available bandwidth of the amplifier.

Optimally, the bandwidth of amplifier 106 would extend from zero Hertz to a frequency (e.g., $10^9$ Hz) greater than the fastest signal to be sensed and would have a constant gain over the entire bandwidth. Unfortunately, this is not possible. Because the test signal is being acquired through a capacitor (i.e., coupling capacitance 103), probe 102 has a zero at zero Hertz and a pole at some low-frequency $f_1$. This causes signal frequencies below $f_1$ to be attenuated.

Additionally, amplifier 106 has a characteristic high-frequency roll-off or pole which is caused by parasitic impedances within the active devices of amplifier 106. This high-frequency pole is located at a frequency $f_2$.

Figure 12:
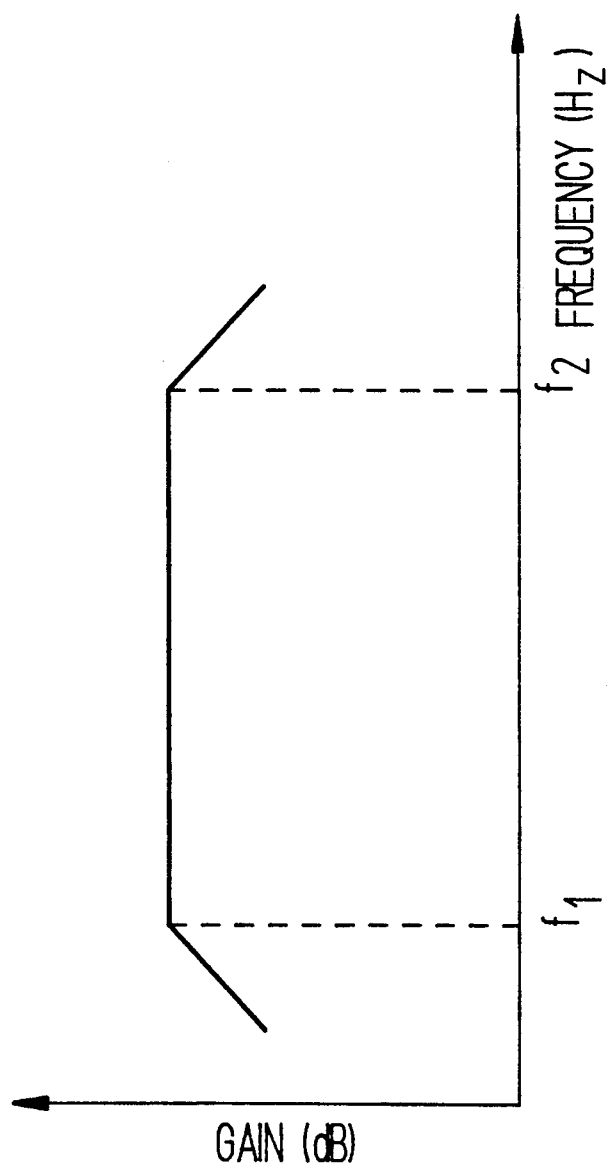
FIG. 12 is a sample Bode plot (gain only) of the desired frequency response for amplifier 106.

A sample Bode plot (gain in decibels versus frequency on a logarithmic scale) for amplifier 106 is shown in FIG. 12 (only gain is shown, phase has been omitted). The gain is substantially constant between the low-frequency pole (at $f_1$) and the high-frequency pole (at $f_2$). The frequency span ($f_1$ to $f_2$) over which the gain is relatively stable or "flat" is known as the "bandwidth" of the amplifier.

The frequency ($f_1$) of the low-frequency pole is calculated as follows:

$$f_1 = \frac{1}{2\pi R_{IN} C_{IN}}$$

where:
$R_{IN}$ = input resistance
$C_{IN}$ = total input capacitance.

In order to provide a wide bandwidth, it is desirable to decrease $f_1$ to as low a frequency (e.g. DC) as possible. To accomplish this, $R_{IN}$ should be made a large as possible (i.e., amplifier 106 should have a large input resistance). The small size of the input capacitance (which is dictated by the coupling capacitance size and signal attenuation considerations as discussed above), however, will limit how low $f_1$ can be made. Accordingly, it is difficult get a good low-frequency response for amplifier 106 because of the very low (e.g., 5-10 fF) coupling capacitance which limits how large $C_{IN}$ can be made.

If $C_{IN}$ is made larger to improve the low-frequency response of the amplifier, then attenuation of the signal will be increased such that greater gain is required from the amplifier. If the signal is attenuated too much, then it cannot be distinguished from the electrical noise of the amplifier. Thus, amplifier 106 cannot be produced with a "flat" gain down to DC and a design tradeoff must be made. The tradeoff is low-frequency performance for signal strength.

On the high-frequency end, it is desirable to push $f_2$ out to as high a frequency as possible. This will allow probe 102 to be responsive to the greatest spectrum of signal frequencies. The particular design of amplifier 106 determines the location of $f_2$. In order to maximize $f_2$, amplifier 106 should be designed to minimize parasitic and distributed impedances and should utilize high-bandwidth active devices.

ANALOG SIGNALS

For sensing analog signals, it is normally desired to preserve the low-frequency components to the greatest extent possible. Thus, $f_1$ should be minimized. To accomplish this, $R_{IN}$ should be maximized. Further, $C_{IN}$ may be increased in size slightly if the capacitively sensed signal has sufficient magnitude to allow the additional attenuation without being lost in the amplifier noise.

The high-frequency response of amplifier 106 should be made as high as possible to follow the fastest component of the analog signal.

DIGITAL SIGNALS

For digital signals, on the other hand, the high-frequency response of the amplifier is more important than the low-frequency response. A good high-frequency amplifier response is required in order to follow the fast transition edges of digital signals. The low-frequency component (which are lost in the differentiation) of the digital signals primarily consist of near DC frequencies which can be reconstructed using reconstruction circuit 110 (as described below).

The key is to capture only the transition edges of the digital signal and to then reconstruct the signal therefrom. For capturing the transition edges of a digital signal, only the high-frequency response of the amplifier is important. For example, modern digital devices having one nsec (nanosecond or $10^{-9}$ seconds) edges or rise/fall times are common. For reliable detection of such edges, the amplifier should have a high-frequency pole at approximately 366 MHz or greater. This requirement was estimated as follows:

$$V_1 = V_2 e^{-\omega t}$$

for a 90% rise/fall ratio:

$$e^{-\omega t} = \frac{V_1}{V_2} = .10$$

using $\omega = 2\pi f$, and solving for $f$ yields:

-continued
$$f = \frac{-\ln(0.1)}{2\pi t} \approx \frac{.366}{t}$$

where:
 $V_1$ and $V_2$ = the two logic voltages
 t = rise/fall time of edge for 90% voltage swing
 f = frequency in Hertz.

Figure 13:
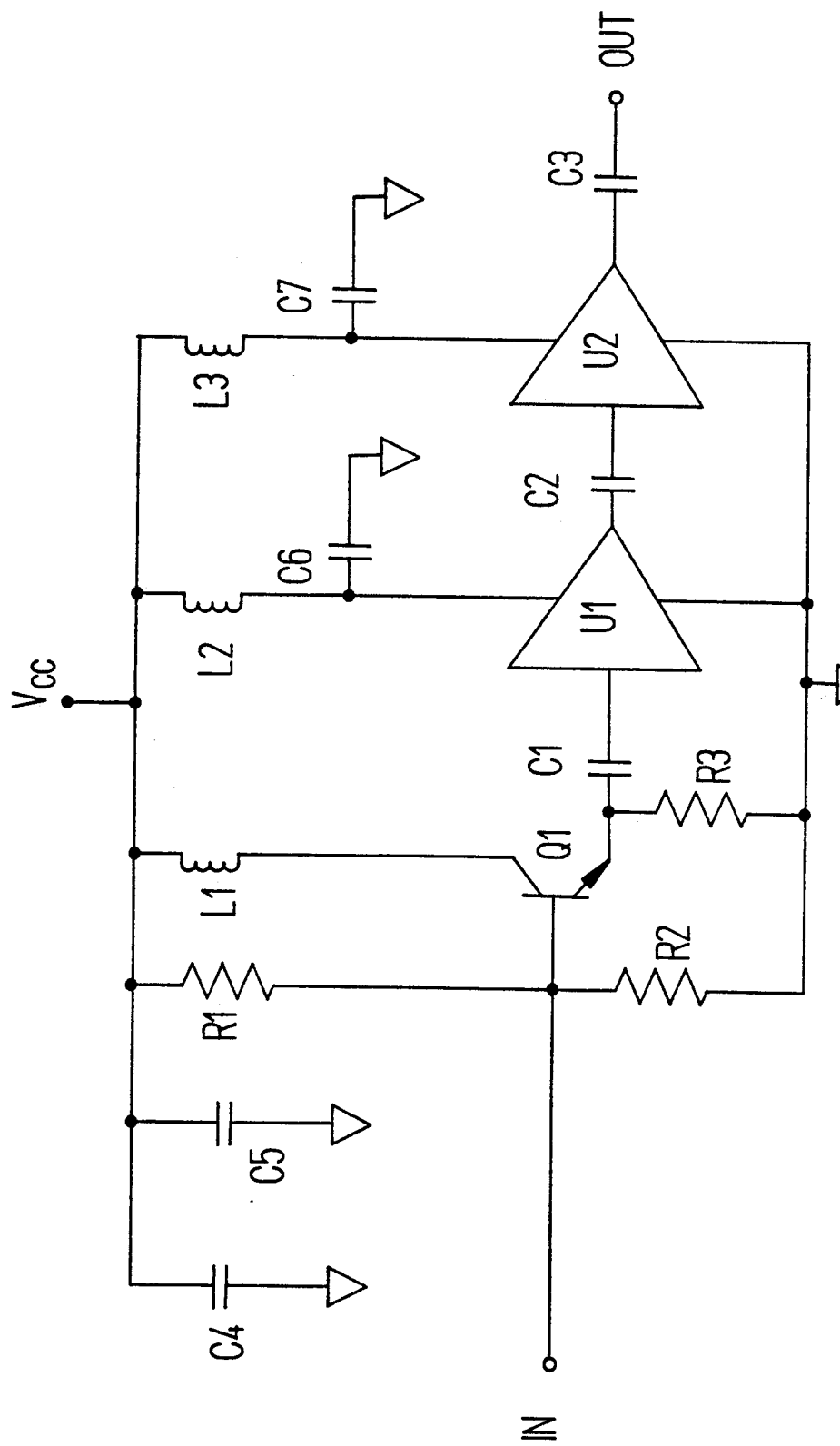
FIG. 13 is a schematic diagram of the currently preferred embodiment of amplifier 106.

At present, the preferred design of amplifier 106 for sensing digital signals is as shown in FIG. 13. Amplifier 106 includes a transistor Q1 cascaded with two integrated amplifiers U1, U2. Q1 is connected in an emitter follower configuration. This configuration helps to increase the input impedance of amplifier 106. Q1 is an NPN bipolar junction transistor, part number MPSH10, manufactured by Motorola, Incorporated of Schaumburg, Ill. U1 and U2 are part number NE5205N integrated amplifiers available from Signetics Company of Sunnyvale, Calif. The resistors, capacitors and inductors have the following values:

R1 = 21.5 KΩ
R2 = 16.22 KΩ
R3 = 619 Ω
C1 = 0.01 μF
C2 = 0.01 μF
C3 = 0.01 μF
C4 = 0.01 μF
C5 = 1.0 μF
C6 = 0.01 μF
L1 = Ferrite Bead
L2 = Ferrite Bead
L3 = Ferrite Bead This amplifier was found to have a gain of 37 dB and an input capacitance of 5 pF. To test its performance when AC-coupled through a small coupling capacitance, a one-inch piece of 50 ohm, semi-rigid coax (overall O.D. = 85 mils, inner conductor O.D. = 20 mils) whose free end was insulated with lacquer was connected to the input to serve as a capacitive prove. Addition of the probe raised the input capacitance to approximately 7 pF. Placing the tip of the probe near a signal-carrying conductor resulted in a coupling capacitance of 50 fF. Using an HP8753C Network Analyzer (available from Hewlett-Packard Company of Palo Alto, Calif.), the capacitively coupled circuit was shown to have an overall gain of −6 dB from approximately 4 MHz ($f_1$) to 550 MHz ($f_2$). Phase shift was linear throughout the pass-band.

Many other high gain, large bandwidth amplifiers are known in the art. The example given above is provided for illustration purposes, and a person of skill in the art will recognize that various alternate designs may be used. Further, the inventors believe that, with additional refinements, an amplifier circuit similar to that described above may achieve a bandwidth greater than 1 GHz (Giga or $10^9$ Hertz). Practically speaking, this will be realized by an amplifier having a low-frequency roll-off ($f_1$) below 20 KHz (i.e., $C_{IN}$=5 pF and $R_{IN}$>1.6MΩ) and a high-frequency roll-off ($f_2$) of 1 GHz or more.

Additionally, feedback may be used to tailor the properties of the amplifiers described above. The use of negative feedback to attain wider bandwidth and greater stability at the expense of lower gain is widely known in the art. Limited positive feedback may also be useful. The use of positive feedback with unity loop-gain or "bootstrapping" is also widely practiced. By carefully choosing the point(s) in the circuit to which bootstrapping is applied, various effects may be achieved. Bootstrapping the probe shield, for example, could be used to reduce the effective input capacitance and increase the overall gain at the expense of a lower high-frequency pole (at $f_2$). More attractive is bootstrapping the input bias resistor(s) to raise the effective input resistance, thereby lowering the low-frequency pole (at $f_1$) without affecting the high-frequency pole or the overall gain.

Because the gain of amplifier 106 is directly dependent on the coupling capacitance which is in turn dependent on the distance between the target trace and the probe tip, the amplitude of the signal output by amplifier 106 may vary dramatically with the distance between the probe tip and the trace being probed. This may cause problems with amplifier saturation. To remedy this, an automatic gain control (AGC) circuit may be incorporated into amplifier 106. AGC schemes are known in the art.

RECONSTRUCTION CIRCUIT

Figure 14:
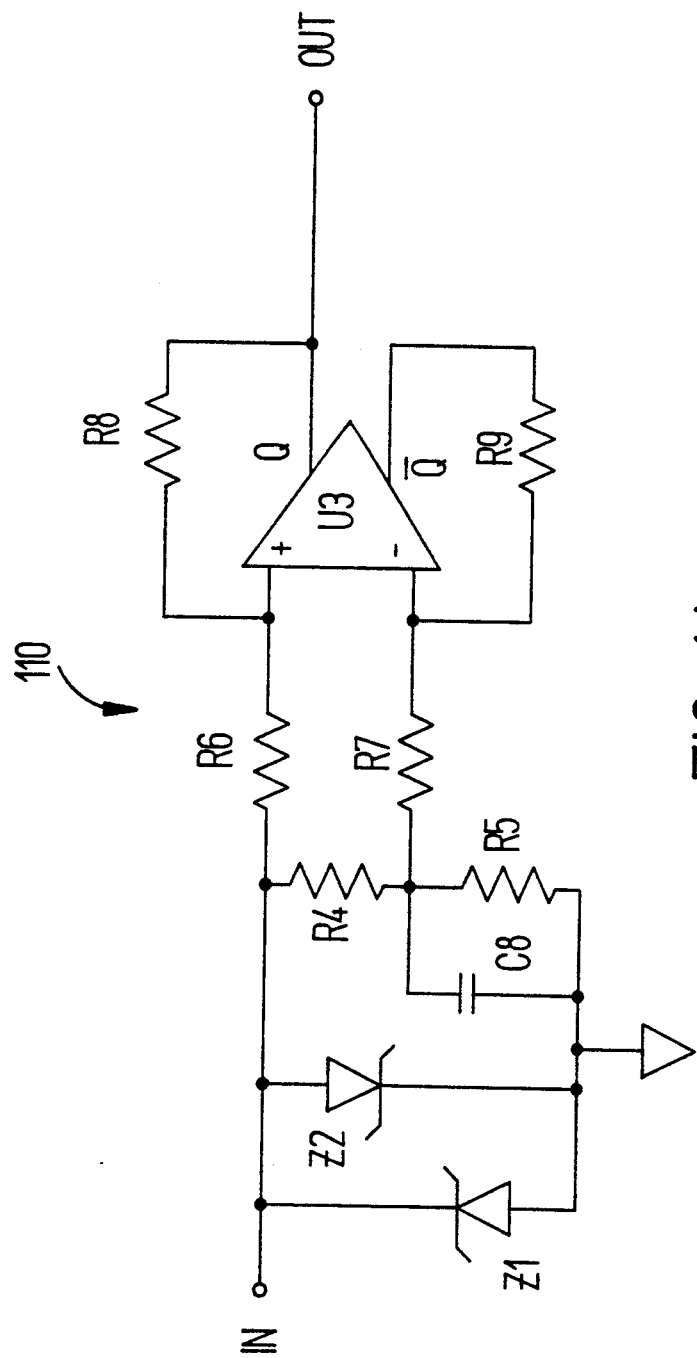
FIG. 14 is a schematic diagram of the preferred embodiment of reconstruction circuit 110.

A schematic diagram of the preferred embodiment of reconstruction circuit 110 is shown in FIG. 14. Circuit 110 is a bi-stable latch constructed using a comparator U3. Zener diodes Z1 and Z2 clamp the input line to a predetermined voltage range. Resistors R6 and R8 provide hysteresis to circuit 110 by providing positive feedback (e.g., 1% feedback in the preferred embodiment) when output "Q" (i.e., the positive output) is HIGH. Similarly, resistors R7 and R9 provide identical hysteresis when output Q is LOW. Resistors R4 and R5 along with capacitor C8 provide a reference voltage to comparator U3.

In the preferred embodiment, U3 is a LT1016 comparator available from Linear Technologies Corporation of Milpitas, Calif. The components have the following values:

Z1 and Z2 = 400 mV zener voltage
R4 and R5 = 37.5 Ω
R6 and R7 = 500 Ω
R8 and R9 = 50KΩ
C8 = 27 pF.

With these component values, the input to circuit 110 will be clamped to ±400 mV. The reference voltage will be equal to one half of the input voltage with a delay (i.e., at higher frequencies) of 500 psec (pico or $10^{-12}$ seconds) to 1 nsec. The hysteresis of the circuit will be equal to 40 mV each direction (80 mV total).

This embodiment of reconstruction circuit 110 was used with the previously described probe/amplifier combination to successfully detect and reconstruct digital signals up to 70 MHz in frequency from solder resist covered pads, traces, and vias, as well as from an innerlayer trace of a multi-layer PCB. It is understood, however, that this currently preferred embodiment of reconstruction circuit 110 is provided as an example only. Much faster comparator IC's are available and could be used for comparator U3.

CONVERSION OF CONVENTIONAL PROBES TO CAPACITIVE COUPLING

For certain applications, especially where a small probe size is not critical, many conventional ohmic contact type, active probes, such as an active oscilloscope probe, can be converted to non-contact probes. This is accomplished by fitting the active probe with a shield adapter. This is illustrated in the following example.

A conventional ohmic contact type, active oscilloscope probe 1500 is shown in FIG. 15(a). Oscilloscope probe 1500 includes a body portion 1502, an insulating nose cone 1506, a probe tip 1508, and an amplifier circuit 1504 situated within body portion 1502. As indicated, body portion 1502 is normally connected to ground.

FIG. 15(b) shows probe 1500 after it has been converted to a non-contact probe. A shield adapter 1510 has been mounted on probe 1500. Shield adaptor 1510 is a cylinder having a conical end portion 1512. End portion 1512 has an opening 1514 adapted to align with probe tip 1508 to form the active region of probe 1500. Shield adapter 1510 is made from a conductive material such as aluminum and is anodized to provide electrical isolation. A portion 1516 of shield adapter 1510 should not be anodized on its inner surface so that electrical contact can be made between probe body 1502 (i.e., ground) and shield adapter 1510.

Probe tip 1508 should be slightly recessed with respect to opening 1514 so that inadvertent ohmic contact cannot be made with a conductor being probed. Alternatively, if probe tip 1508 is flush with the sense end of shield adapter 1510, then probe tip 1508 should be anodized or insulated with a thin insulating cap.

Several active oscilloscope probes which may be converted to non-contact probes are provided as examples. These include the HP1141 probe, the P6201 probe, and the P6204 probe. The HP1141 is a 1× (i.e., gain=1) probe manufactured by Hewlett-Packard Company of Palo Alto, Calif. The HP1141 exhibits 1MΩ input resistance, 7 pF input capacitance, and a bandwidth of DC to 200 MHz. When converted to a non-contact probe as described above (assuming that shield adapter 1510 would introduce a worst-case of 2 pF to the input capacitance), the HP1141 would have an approximate bandwidth of 17.7 KHz to 200 MHz.

The P6201 is a 1× (i.e., gain=1) probe manufactured by Tektronics, Inc., of Beaverton, Oreg. The P6201 exhibits 100KΩ input resistance, 3 pF input capacitance, and a bandwidth of DC to typically 1.1 GHz. When converted to a non-contact probe as described above (assuming that shield adapter 1510 would introduce a worst-case of 2 pF to the input capacitance), the P6201 would have an approximate bandwidth of 318 KHz to 1.1 GHz.

The P6204 is a 10× (i.e., gain=0.1) probe manufactured by Tektronics, Inc., of Beaverton, Oreg. The P6204 exhibits 10MΩ input resistance, 2 pF input capacitance, and a bandwidth of DC to 1 GHz. When converted to a non-contact probe as described above (assuming that shield adapter 1510 would introduce a worst-case of 2 pF to the input capacitance), the P6201 would have an approximate bandwidth of 4 KHz to 1 GHz.

USES/APPLICATIONS

Because the invention allows signal acquisition without physical contact, signals can be acquired through layers of solder mask or conformal coating. Further, signals can be acquired from inner traces of a multi-layer PCB. Additionally, the low coupling capacitance of the present invention guarantees minimal loading of the circuit under test and ensures that probing will not interfere with the operation of sensitive, high-speed circuitry.

The probe may be used in a variety of applications. For example, the probe may be fixed to a robot arm for automatic positioning and probing; a plurality of probes may be fixed in an array similar to the bed-of-nails type probes used by an automated tester; or the probe may be used in a hand-held fashion with an oscilloscope, logic analyzer, or during edge-connector functional back-trace testing.

Figure 16:
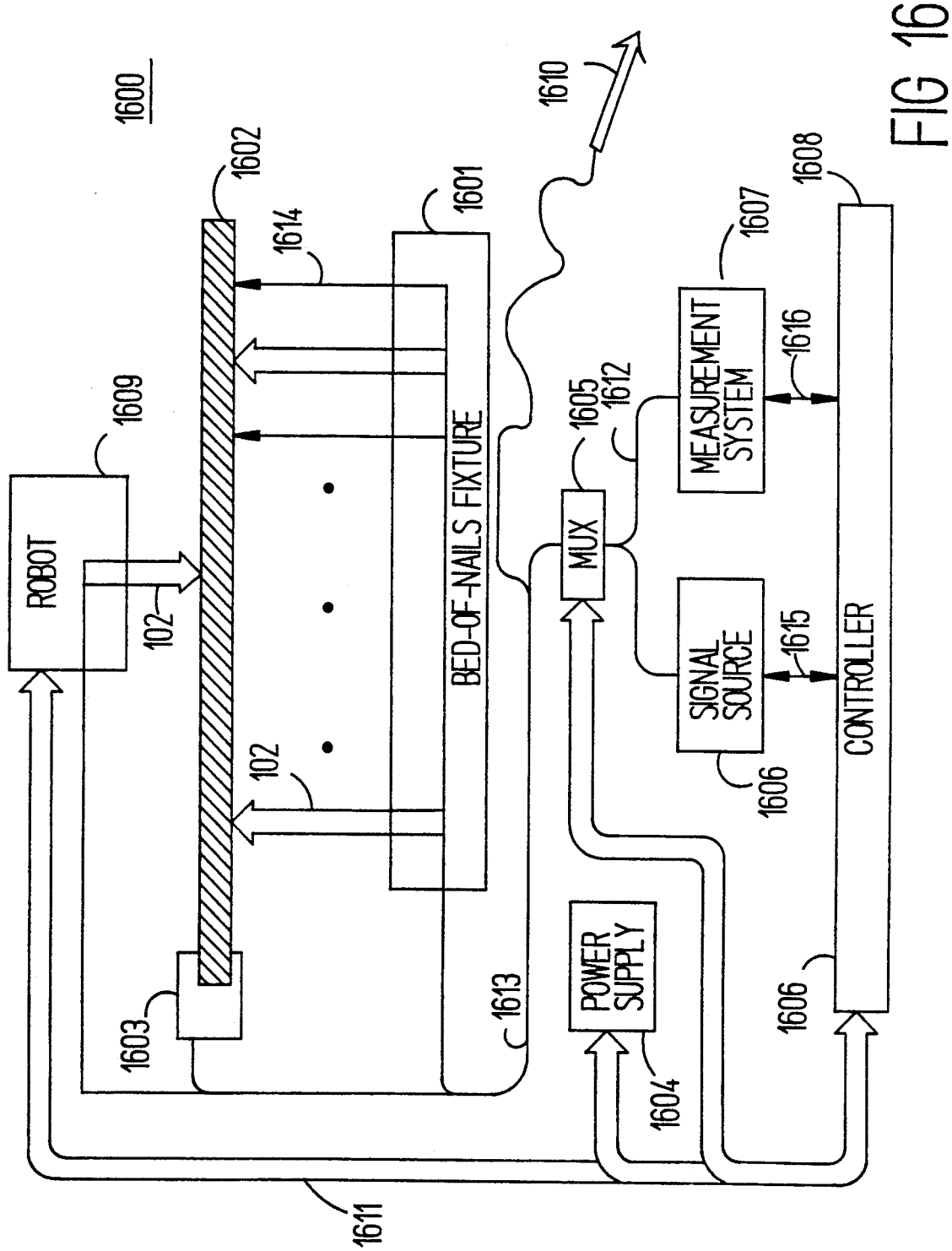
FIG. 16 is a block diagram of an electronic printed circuit board test system.

An example of an automated PCB test system which uses probe 102 of the invention is shown in FIG. 16. Test system 1600 includes a controller 1608, a power supply 1604, a signal source 1606, a measurement system 1607, a multiplexor (MUX) 1605, a bed-of-nails fixture 1601, an edge-connector 1603, a robotic positioner 1609, and a hand-held probe 1610. A board or assembly under test (BUT) 1602 is interfaced with system 1600 over a signal bus 1613 via edge-connector 1603 and/or bed-of-nails fixture 1601.

Power supply 1604 provides DC power to BUT 1602 over signal bus 1613. Signal source 1606 includes analog function and frequency generators and digital pattern generators which generate the test signals required for testing BUT 1602. Measurement system 1607 is adapted to receive and analyze test signals from BUT 1602. Measurement system 1607 includes a plurality of digital receivers, signature analysis circuitry, and a variety of analog and/or digital measurement instrumentation (e.g., oscilloscopes, logic analyzers, distortion meters, etcetera).

MUX 1605 receives test signals from signal source 1606 over a bus 1612 and supplies these test signals to the appropriate nodes of BUT 1602 over signal bus 1613. MUX 1605 further receives signals from the appropriate nodes of BUT 1602 over signal bus 1613 and provides these signals to measurement system 1607 over bus 1612.

Controller 1608 controls testing of board 1602. Controller 1608 communicates with signal source 1606 over a bus 1615 and with measurement system 1607 over a bus 1616. Controller 1608 communicates with power supply 1604, MUX 1606, and robotic positioner 1609 over a control bus 1611.

Bed-of-nails fixture 1601 may includes a plurality of both capacitive probes 102 and conventional ohmic probes 1610. Further, a capacitive probe 102 may be used with robotic positioner 1609 and with hand-held probe 1610. This brings the many advantages of the non-contact probe of the invention to an automated PCB tester.

While the invention has been particularly shown and described with reference to a preferred embodiment thereof, it will be understood by those skilled in the art that various changes in form and details may be made therein without departing from the spirit and scope of the invention.

We claim:

1. A capacitively coupled probe for acquiring a digital electrical signal from a source conductor, the probe comprising:
   a body portion;
   a probe tip coupled to said body portion, said probe tip being configured to capacitively sense the digital electrical signal from the source conductor to produce a sensed signal, said probe tip including an inner conductor and a shield conductor, said shield conductor substantially surrounding said inner conductor to define an active region of said sense means, wherein said inner conductor has a cross-sectional area at said active region of not greater than 315 square mils and said probe tip has a cross-sectional area at said active region not greater than 5675 square mils such that said probe tip is configured to acquire the digital electrical signal from a correspondingly dimensioned source conductor while substantially excluding unwanted signals from adjacent conductors;
   amplifier means, coupled to said probe tip, for receiving and amplifying said sensed signal to produce an amplified signal, said amplifier means being disposed in said body portion of the probe closely adjacent to said probe tip; and
   reconstruction means coupled to said amplifier means for receiving said amplified signal and for reproducing the digital electrical signal therefrom.

2. The capacity coupled probe of claim 1, wherein said probe tip exhibits a coupling capacitance of less than 100 fF when disposed closely adjacent to, but at least one mil from, the source conductor.

3. The capacitively coupled probe of claim 1, wherein said probe tip exhibits a coupling capacitance of not greater than 10 fF when placed closely adjacent to, but at least one mil from, the source conductor.

4. The capacitively coupled probe of claim 1, wherein said inner conductor and said shield conductor of said probe tip are arranged in a substantially coaxial configuration and wherein said active region of said probe tip has a diameter not greater than twelve mils.

5. The capacitively coupled probe of claim 4, further comprising an end ring fixedly attached to said shield conductor to reduce the size of said active region of said probe tip.

6. The capacitively coupled probe of claim 5, wherein said probe tip exhibits a coupling capacitance not greater than 10 fF when placed closely adjacent to, but at least one mil from, the source conductor.

7. The capacitively coupled probe of claim 1, further comprising an end ring fixedly attached to said shield conductor to reduce the size of said active region of said probe tip.

8. The capacitively coupled probe of claim 1, wherein said inner conductor has a cross-sectional area at said active region of not greater than 13 square mils and said probe tip has a cross-sectional area at said active region not greater than 707 square mils such that said probe tip is configured to acquire the digital electrical signal from a correspondingly dimensioned source conductor while substantially excluding unwanted signals from adjacent conductors.

9. A capacitively coupled probe for acquiring an electrical signal from a source conductor, the probe comprising:
   a probe tip including an inner conductor and a conductive shield substantially surrounding said inner conductor, said probe tip having an active region which is adapted to capacitively sense the electrical signal from the source conductor to produce a sensed signal, wherein said inner conductor has a cross-sectional area at said active region of not greater than 315 square mils and said probe tip has a cross-sectional area at said active region not greater than 5675 square mils such that said probe tip is configured to acquire the electrical signal from a correspondingly dimensioned source conductor while substantially excluding unwanted signals from adjacent conductors;
   a probe body mechanically coupled to said probe tip; and an amplifier circuit disposed in said probe body proximate to said probe tip, said amplifier circuit being electrically connected to said probe tip and being adapted to receive and amplify said sensed signal to produce an amplified signal.

10. The capacitively coupled probe of claim 9, wherein said inner conductor and said conductive shield are arranged in a substantially coaxial configuration, and wherein said active region has a diameter not greater than twelve mils.

11. The capacitively coupled probe of claim 9, wherein said probe tip exhibits a coupling capacitance not greater than 100 fF when disposed closely adjacent to, but at least one mil from, the source conductor.

12. The capacitively coupled probe of claim 9, wherein said probe tip exhibits a coupling capacitance not greater than 10 fF when placed closely adjacent to, but at least one mil from, the source conductor.

13. The capacitively coupled probe of claim 9, wherein said inner conductor has a cross-sectional area at said active region of not greater than 13 square mils and said probe tip has a cross-sectional area at said active region not greater than 707 square mils such that said probe tip is configured to acquire the electrical signal from a correspondingly dimensioned source conductor while substantially excluding unwanted signals from adjacent conductors.

14. The capacitively coupled probe of claim 9, wherein said inner conductor and said conductive shield of said probe tip are arranged in a substantially coaxial configuration and wherein said active region of said probe tip has a diameter not greater than twelve mils.

15. The capacitively coupled probe of claim 14, further comprising an end ring fixedly attached to said conductive shield to reduce the size of said active region of said probe tip.

16. The capacitively coupled probe of claim 15, wherein said probe tip exhibits a coupling capacitance not greater than 10 fF when placed closely adjacent to, but at least one mil from, the source conductor.

* * * * *